(12) United States Patent
Sugahara

(10) Patent No.: US 7,695,117 B2
(45) Date of Patent: Apr. 13, 2010

(54) PIEZOELECTRIC ACTUATOR, LIQUID TRANSPORTING APPARATUS WHICH INCLUDES PIEZOELECTRIC ACTUATOR, AND METHOD OF MANUFACTURING PIEZOELECTRIC ACTUATOR

(75) Inventor: Hiroto Sugahara, Aichi-ken (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 255 days.

(21) Appl. No.: 11/903,618

(22) Filed: Sep. 24, 2007

(65) Prior Publication Data
US 2008/0079784 A1 Apr. 3, 2008

(30) Foreign Application Priority Data
Sep. 29, 2006 (JP) ............................. 2006-269903

(51) Int. Cl.
*B41J 2/045* (2006.01)
(52) U.S. Cl. ...................................................... 347/70
(58) Field of Classification Search ................... 347/70, 347/68–69, 71–72, 54, 56, 9, 14–15, 46, 347/62–65; 400/124.1
See application file for complete search history.

(56) References Cited

U.S. PATENT DOCUMENTS

| 6,450,626 B2 | 9/2002 | Ikeda et al. |
| 2003/0142173 A1* | 7/2003 | Takahashi ..................... 347/68 |
| 2006/0082619 A1 | 4/2006 | Yasui |

FOREIGN PATENT DOCUMENTS

| JP | 2000103056 | 4/2000 |
| JP | 2001179969 | 7/2001 |
| JP | 2006093348 | 4/2006 |

* cited by examiner

*Primary Examiner*—K. Feggins
(74) *Attorney, Agent, or Firm*—Eugene Ledonne; Joseph W. Treloar; Frommer Lawrence & Haug LLP

(57) ABSTRACT

There is provided a piezoelectric actuator which includes a piezoelectric material layer in which, a portion sandwiched between a first electrode and a second electrode is an active portion, and a vibration plate which is arranged on a surface of the piezoelectric material layer. The piezoelectric material layer is polarized in a direction parallel to a direction of thickness thereof, and a direction of polarization of a central portion in the active portion and a direction of polarization of an edge portion excluding the central portion, in the active portion are mutually opposite. Accordingly, even when a drive voltage is low, it is possible to increase sufficiently an amount of deformation of the piezoelectric actuator.

13 Claims, 26 Drawing Sheets

PAPER FEEDING DIRECTION

PIEZOELECTRIC ACTUATOR, LIQUID TRANSPORTING APPARATUS WHICH INCLUDES PIEZOELECTRIC ACTUATOR, AND METHOD OF MANUFACTURING PIEZOELECTRIC ACTUATOR

CROSS-REFERENCE TO RELATED APPLICATIONS

This application claims priority from Japanese Patent Application No. 2006-269903, filed on Sep. 29, 2006, the disclosure of which is incorporated herein by reference in its entirety.

BACKGROUND OF THE INVENTION

1. Field of the Invention

The present invention relates to a piezoelectric actuator which deforms a piezoelectric material layer by applying an electric field to the piezoelectric material layer, a liquid transporting apparatus which includes the piezoelectric actuator, and a method of manufacturing the piezoelectric actuator.

2. Description of the Related Art

In US Patent Application Laid-open No. 2006082619 (corresponds to Japanese Patent Application Laid-open No. 2006-093348), an ink-jet head which transports an ink to nozzles, and jets the ink onto a paper from these nozzle has been disclosed. This ink-jet head includes a channel unit in which ink channels including pressure chambers which communicate with the nozzles are formed, and a piezoelectric actuator which causes the ink to be jetted from the nozzles by changing a volume inside the pressure chambers.

The piezoelectric actuator includes a vibration plate which covers openings of the pressure chambers, a piezoelectric material layer which is formed on a surface of the vibration plate, and subjected to a polarization process such that the piezoelectric material layer is polarized in a direction of thickness thereof, and an individual electrode which is formed on a surface of the piezoelectric material layer, on a side opposite to a side of the vibration plate, in an area slightly smaller than an area facing the pressure chamber. The vibration plate is kept at a ground electric potential, and functions as a common electrode. In other words, an active portion, of the piezoelectric material layer, sandwiched between the individual electrode and the common electrode is positioned at a central portion of the piezoelectric material layer facing the pressure chamber.

In the abovementioned piezoelectric actuator, when a predetermined driving electric potential is applied to the individual electrode, an electric field is generated in the active portion, of the piezoelectric material layer, sandwiched between the individual electrode and the common electrode; and the active portion is contracted in a direction orthogonal to a direction of thickness thereof. Moreover, due to the contraction of the operation portion of the piezoelectric material layer, a first portion, of the piezoelectric actuator, corresponding to the operation portion positioned at the central portion of the piezoelectric material layer facing the pressure chamber, is deformed spontaneously to form a projection toward the vibration plate; and a second portion, of the piezoelectric actuator, surrounding the first portion is deformed passively due to the first portion. Accordingly, an entire portion of the piezoelectric actuator, facing the pressure chambers is deformed to form a projection toward the pressure chamber. Due to the deformation, the volume inside the pressure chamber is decreased, and a jetting pressure is exerted on an ink in the pressure chamber.

SUMMARY OF THE INVENTION

However, as shown in the abovementioned piezoelectric actuator, when an entire portion, of the piezoelectric actuator, facing the pressure chamber is deformed by causing only a central portion, of a piezoelectric actuator, facing the pressure chamber to deform spontaneously, a drive voltage to be applied to the piezoelectric actuator (an electric potential difference between a common electrode and an individual electrode), for having a sufficient amount of deformation for jetting an ink from the nozzle by changing a volume of the pressure chamber becomes comparatively higher. Consequently, a power consumption of an ink-jet head is increased. Moreover, specifications of components of an electrical system are determined by a magnitude of a drive voltage at the time of ink jetting, and when the drive voltage is substantial, components which can withstand high voltage are to be used. Consequently, there is an increase in a cost of the components of the electrical system.

In view of this, an object of the present invention is to provide a piezoelectric actuator which is capable of increasing sufficiently an amount of deformation even when the drive voltage is low, a liquid transporting apparatus which includes this piezoelectric actuator, and a method of manufacturing the piezoelectric actuator.

According to a first aspect of the present invention, there is provided a method for manufacturing a piezoelectric actuator which includes a piezoelectric layer having a predetermined active portion, the method comprising:

providing a vibration plate;

providing a piezoelectric layer on a surface of the vibration plate;

forming a first polarizing electrode on one surface of the piezoelectric layer, at a central portion of a first area of the piezoelectric layer, the first area overlapping with a predetermined active area to be the active portion of the piezoelectric layer;

forming a second polarizing electrode on the one surface of the piezoelectric layer at an edge portion of the first area the edge portion being different from the central portion;

forming a first electrode on the other surface of the piezoelectric layer, at a second area overlapping entirely with the active area of the piezoelectric layer;

polarizing a first portion of the piezoelectric layer in a predetermined direction by applying an electric field in the predetermined direction to the first portion which is arranged between the first electrode and the first polarizing electrode;

polarizing a second portion of the piezoelectric material layer in an opposite direction opposite to the predetermined direction by applying an electric field in the opposite direction to the second portion which is arranged between the first electrode and the second polarizing electrode; and forming a second electrode, on the other surface of the piezoelectric layer, at a portion of the second area.

The step of polarizing the first area is carried out after the step of forming the first polarizing electrode and the step of forming the first electrode, and the step of polarizing the second area is carried out after the step of forming the second polarizing electrode and the step of forming the first electrode. Moreover, once this condition is satisfied, the steps of forming the first polarizing electrode, and the second polarizing electrode, the step of forming the first electrode, and the steps of first polarization and second polarization may be carried out in any order. Furthermore, the step of forming the second electrode is included in both the cases namely a case of forming newly the second electrode separately from the first polarizing electrode and the second polarizing electrode, and a case of forming the second polarizing electrode by using at least a part of the first polarizing electrode and the second polarizing electrode.

An order of polarizing the first area and polarizing the second area is immaterial.

According to the first aspect of the present invention, extension and contraction characteristics of the central portion and the edge portion of the operating section, in a direction orthogonal to a direction of the electric field, when the electric field is applied to the active portion, are mutually opposite. In other words, one of the central portion and the edge portion is contracted, and the other is extended. Consequently, a portion corresponding to the central portion of the active portion and another portion corresponding to the edge portion of the active portion in the piezoelectric actuator are bent spontaneously in mutually opposite directions along the direction of thickness thereof. Accordingly, when the location corresponding to the active portion is let to be the location which is to be deformed in the piezoelectric actuator, as compared to a case in which, only a central portion of the location to be deformed is bent spontaneously, and the edge portion is bent by being dragged by the central portion, it is possible to increase (make substantial) an amount of deformation. Accordingly, even when a drive voltage is low, it is possible to increase sufficiently the amount of deformation of the piezoelectric actuator.

In the method for manufacturing the piezoelectric actuator of the present invention, the vibration plate may be electroconductive, and may serve as the first electrode. In this case, the step of arranging the vibration plate on one surface of the piezoelectric layer is equivalent to the step of forming the first electrode. Accordingly, since it is not necessary to provide separately the step of forming the first electrode apart from the step of arranging the vibration plate on one surface of the piezoelectric layer, it is possible to reduce the number of steps.

In the method for manufacturing the piezoelectric actuator of the present invention, the first polarizing electrode and the second polarizing electrode may be formed to be mutually isolated, and the first portion and the second portion are polarized simultaneously. In this case, it is possible to reduce a time taken for the manufacturing process as compared to a case in which the steps of polarizing the first portion and the step of polarizing the second portion are carried out separately.

In the method for manufacturing the piezoelectric actuator of the present invention, the first polarizing electrode and the second polarizing electrode may be formed simultaneously. In this case, it is possible to shorten further the time taken for the manufacturing process as compared to a case in which the step of forming the first polarizing electrode and the step of forming the second polarizing electrode are carried out separately.

In the method for manufacturing the piezoelectric actuator of the present invention, after forming the first electrode and forming one of the first polarizing electrode and the second polarizing electrode, one of the first portion and the second portion corresponding to the one of the first polarizing electrode and the second polarizing electrode respectively may be polarized, and then, after removing the one of the first polarizing electrode and the second polarizing electrode, the other of the first polarizing electrode and the second polarizing electrode may be formed, and the other of the first portion and the second portion corresponding to the other of the first polarizing electrode and the second polarizing electrode may be polarized.

In this case, since there is no second polarizing electrode on one surface of the piezoelectric layer when the first polarization step is carried out, and there is no first polarizing electrode when the second polarization step is carried out, it is possible to form two areas having mutually different directions of polarization in the active portion, without the two area being isolated. Consequently, as compared to a case in which the two areas having mutually different directions of polarization in the active portion are formed to be isolated, since the entire area in the active portion contributes to the deformation of the piezoelectric actuator, it is possible to improve further a driving efficiency.

In the method for manufacturing the piezoelectric actuator of the present invention, at the time of forming the other of the first polarizing electrode and the second polarizing electrode which is formed after the one of the first and second polarizing electrodes have been formed, the other of the first polarizing electrode and the second polarizing electrode may be formed to partially overlap with an area at which the one of the first polarizing electrode and the second polarizing electrode has been formed. In this case, it is possible to form assuredly without a gap, the two area having mutually different directions of polarization formed in the active portion.

In the method of manufacturing the piezoelectric actuator of the present invention, after forming the first polarizing electrode and the first electrode, polarizing the first area, removing the first polarizing electrodes, forming the second polarizing electrode, and polarizing the second area may be performed in this order; and at the time of forming the second polarizing electrode, the second polarizing electrode may be formed entirely at a periphery of an edge portion of the first area. In this case, it is possible to polarize the ring-shaped edge portion in the active portion in a direction opposite to a direction of polarization of the central portion. In other words, since it is possible to deform spontaneously an entire periphery of the active portion corresponding to the edge portion, in the piezoelectric actuator, it is possible to improve further the driving efficiency.

The method for manufacturing the piezoelectric actuator of the present invention, the active area may include a plurality of individual active areas, and the method may further include;

forming the first polarizing electrode and the second polarizing electrode as a plurality of first individual polarizing electrodes and a plurality of second individual polarizing electrodes, respectively, each corresponding to one of the individual active areas, at the time of forming the first polarizing electrode and the second polarizing electrode;

forming a first connecting wire which connects the first individual polarizing electrodes with each other, before polarizing the first area;

forming a second connecting wire which connects the second individual polarizing electrodes with each other, before polarizing the second area;

disconnecting the first individual polarizing electrodes by cutting off the first connecting wire, after polarizing the first area; and disconnecting the second individual polarizing electrodes by cutting off the second connecting wire, after polarizing the second area. In this case, it is possible to make the connections easily as compared to a case in which the plurality of first individual polarizing electrodes and the plurality of second individual polarizing electrodes are connected by a wiring cable etc.

In the method for manufacturing the piezoelectric actuator of the present invention, after forming the second electrode, the first connecting wire and the second connecting wire may be cut off. For example, in a case in which, in the first (second) connecting wire cutting off (disconnecting) step, a part of the first (second) connecting wire is eliminated such that the connection of the first (second) polarizing electrodes is ceased, an edge of the second electrode is blurred, and makes a contact with the remained portion of the first (second) connecting wire, and the second electrode and the first (second) connecting wire may be shorted. However, according to the abovementioned structure, in the first (second) connecting wire cutting off (disconnecting) step, even when only a part of the first (second) connecting wire is eliminated, since the second electrode and the remained portion of the first (second) connecting wire do not make a contact, it is possible to prevent the second electrode and the first (second) connecting wire from being shorted.

The method for manufacturing the piezoelectric actuator of the present invention, the active area may include a plurality of individual active areas, and the method may further include:

forming the first polarizing electrode and the second polarizing electrode as a plurality of first individual polarizing electrodes and a plurality of second individual polarizing electrodes respectively, each corresponding to one of the individual active areas, at the time of forming the first polarizing electrode and the second polarizing electrode; and forming a plurality of connecting wires each of which connects the first individual polarizing electrodes with each other or connects the second individual polarizing electrodes with each other, one of the first individual electrodes and the second individual electrodes being formed by the formation of one of the first polarizing electrode and the second polarizing electrode;

upon removing one of the first and second polarizing electrodes, one of the first individual polarizing electrodes and the second individual polarizing electrodes may be removed without removing one of the connecting wires; and the other of the first individual polarizing electrodes and the second individual polarizing electrodes, which are formed by the formation of the other of the first polarizing electrode and the second polarizing electrode, may be formed to be mutually connected by the other of the connecting wire.

In this case, it is possible to make the connections easily as compared to a case of connecting the plurality of first polarizing electrodes and the second polarizing electrodes by a wiring cable. Moreover, the connecting wire which is formed in the connecting wire forming step which is carried once, connects the plurality of first polarizing electrodes at the time of the first polarization step, and connects the plurality of second polarizing electrodes at the time of the second polarization step. Consequently, it is possible to reduce the number of steps as compared to a case in which the connecting wire which connects the plurality of first polarizing electrodes and the connecting wire which connects the plurality of second polarizing electrodes are formed in separate steps.

According to a second aspect of the present invention, there is provided a method for manufacturing a piezoelectric actuator which includes a piezoelectric layer having an active portion arranged between a first electrode and a second electrode, the method comprising:

providing a vibration plate;

forming a piezoelectric layer on a surface of the vibration plate;

forming the first electrode on one surface of the piezoelectric layer, and forming the second electrode on the other surface of the piezoelectric layer;

polarizing a central portion of a certain area of the piezoelectric layer in a first direction parallel to a thickness direction of the piezoelectric layer, the certain area being to be the active portion by being arranged between the first and second electrodes; and polarizing an edge portion of the piezoelectric layer, in a second direction which is opposite to the first direction, the edge portion being different from the central portion which is to be the active portion.

According to the second aspect of the present invention, an actuator which includes the piezoelectric layer having two type of active portions in which the direction of the polarization is mutually opposite, can be produced. Accordingly, even when a drive voltage is low, it is possible to increase sufficiently the amount of deformation of the piezoelectric actuator.

According to a third aspect of the present invention, there is provided a piezoelectric actuator including:

a piezoelectric layer in which a first electrode is formed on one surface thereof and a second electrode is formed on the other surface thereof, and in which a portion arranged between the first electrode and the second electrode is an active portion; and a vibration plate which is arranged on the one surface or the other surface of the piezoelectric layer;

wherein the piezoelectric layer is polarized in a direction parallel to a thickness direction thereof, and a first direction of polarization in a central portion of the active portion, and a second direction of polarization in an edge portion, of the active portion, which is different from the central portion are mutually opposite.

According to the third aspect of the present invention, a portion corresponding to the central portion of the active portion and another portion corresponding to the edge portion of the active portion in the piezoelectric actuator are bent spontaneously in mutually opposite directions along the direction of thickness thereof. Accordingly, when the location corresponding to the active portion is let to be the location which is to be deformed in the piezoelectric actuator, as compared to a case in which, only a central portion of the location to be deformed is bent spontaneously, and the edge portion is bent by being dragged by the central portion, it is possible to increase (make substantial) an amount of deformation. Accordingly, even when a drive voltage is low, it is possible to increase sufficiently the amount of deformation of the piezoelectric actuator.

According to a fourth aspect of the present invention, there is provided a liquid transporting apparatus including:

a piezoelectric actuator including a piezoelectric layer in which a first electrode is formed on one surface thereof, and a second electrode is formed on the other surface thereof, and in which a portion arranged between the first electrode and the second electrode is an active portion; and a vibration plate which is arranged on the one surface or the other surface of the piezoelectric layer; and a channel unit in which a plurality of nozzles, and a plurality of pressure chambers which communicate with the nozzles respectively are formed, and which is connected to the vibration plate of the piezoelectric actuator such that the active portion faces each of the pressure chambers, wherein the piezoelectric layer is polarized in a direction parallel to a thickness direction of the piezoelectric layer, and a first direction of polarization in a central portion of the active portion, and a second direction of polarization of an edge portion, of the active portion, which is different from the central portion are mutually opposite.

In the liquid transporting apparatus of the present invention, when an electric field is applied between the first electrode and the second electrode, the first direction of polarization in the central portion of the active portion may be opposite to a direction of the electric field, and the second direction of polarization in the edge portion of the active portion is same as the direction of the electric field. In these cases, when the electric field is applied between the first electrode and the second electrode, the central portion in the active portion is extended in a direction orthogonal to the direction of the electric field, and the edge portion is contracted. Consequently, a portion of the piezoelectric actuator, corresponding to the central portion of the active portion is projected on an opposite side of the pressure chamber. Moreover, a portion corresponding to the edge portion is bent such that an end portion on a side opposite to a side which is connected to the channel unit is displaced toward the opposite side of the pressure chamber. Accordingly, since the portion of the piezoelectric actuator, facing the pressure chamber is projected on the opposite side of the pressure chamber, it is possible to increase a volume of the pressure chamber. As a result, it is possible to realize a pulling-ejection structure, and when the first electrode is let to be at a ground electric potential, it is possible to let the second electrode to be at the ground electric potential when liquid is not jetted from the nozzles, and to improve reliability.

In the liquid transporting apparatus of the present invention, a size of the active portion of the piezoelectric actuator may be larger than a size of the pressure chamber of the channel unit. In this case, since it is possible to deform a portion of the piezoelectric actuator from a periphery of the portion facing the pressure chamber, it is possible to improve further the driving efficiency of the piezoelectric actuator.

DETAILED DESCRIPTION OF THE PREFERRED EMBODIMENTS

Exemplary embodiments of the present invention will be described below with reference to the accompanying diagrams.

First Embodiment

Figure 1:
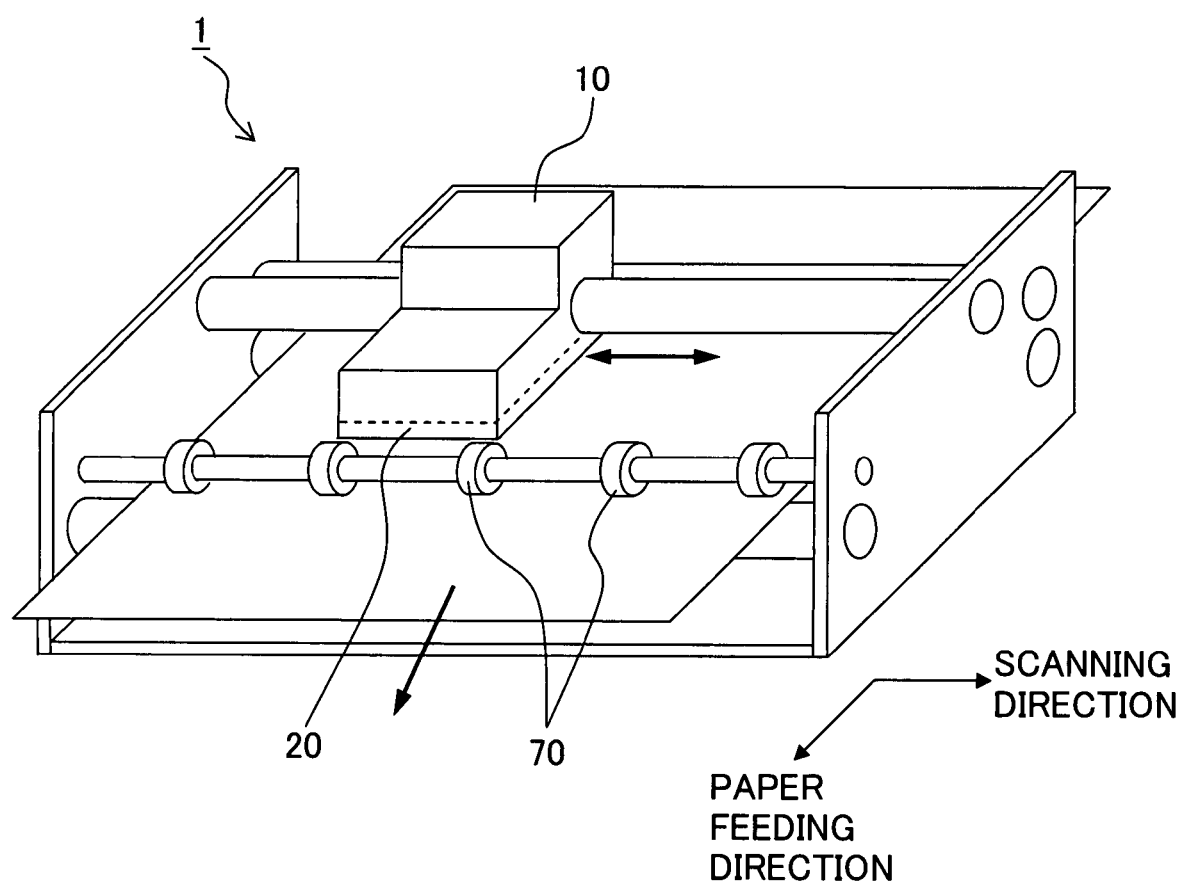
FIG. 1 is a diagram showing a schematic structure of an ink-jet printer according to a first embodiment of the present invention.

A first embodiment is an example in which, the present invention is applied to a piezoelectric actuator used in an ink-jet head in an ink-jet printer. FIG. 1 is a diagram showing a schematic structure of an ink-jet printer according to the first embodiment.

As shown in the FIG. 1, an ink-jet printer 1 mainly includes a carriage 10 which is movable in a scanning direction (left and right direction in FIG. 1); a serial ink-jet head 20 which is supported by the carriage 10 to face a recording paper, and which discharges an ink; and transporting rollers 70 which transport the recording paper in a paper feeding direction (direction from a rear-right toward a front-left). In the ink-jet printer 1, the ink-jet head 20 jets the ink on to the recording paper while moving integrally with the carriage 10 in the scanning direction. Moreover, the recording paper on which the ink-jet head 20 performs recording is discharged in the paper feeding direction by the transporting rollers 70.

Figure 2:
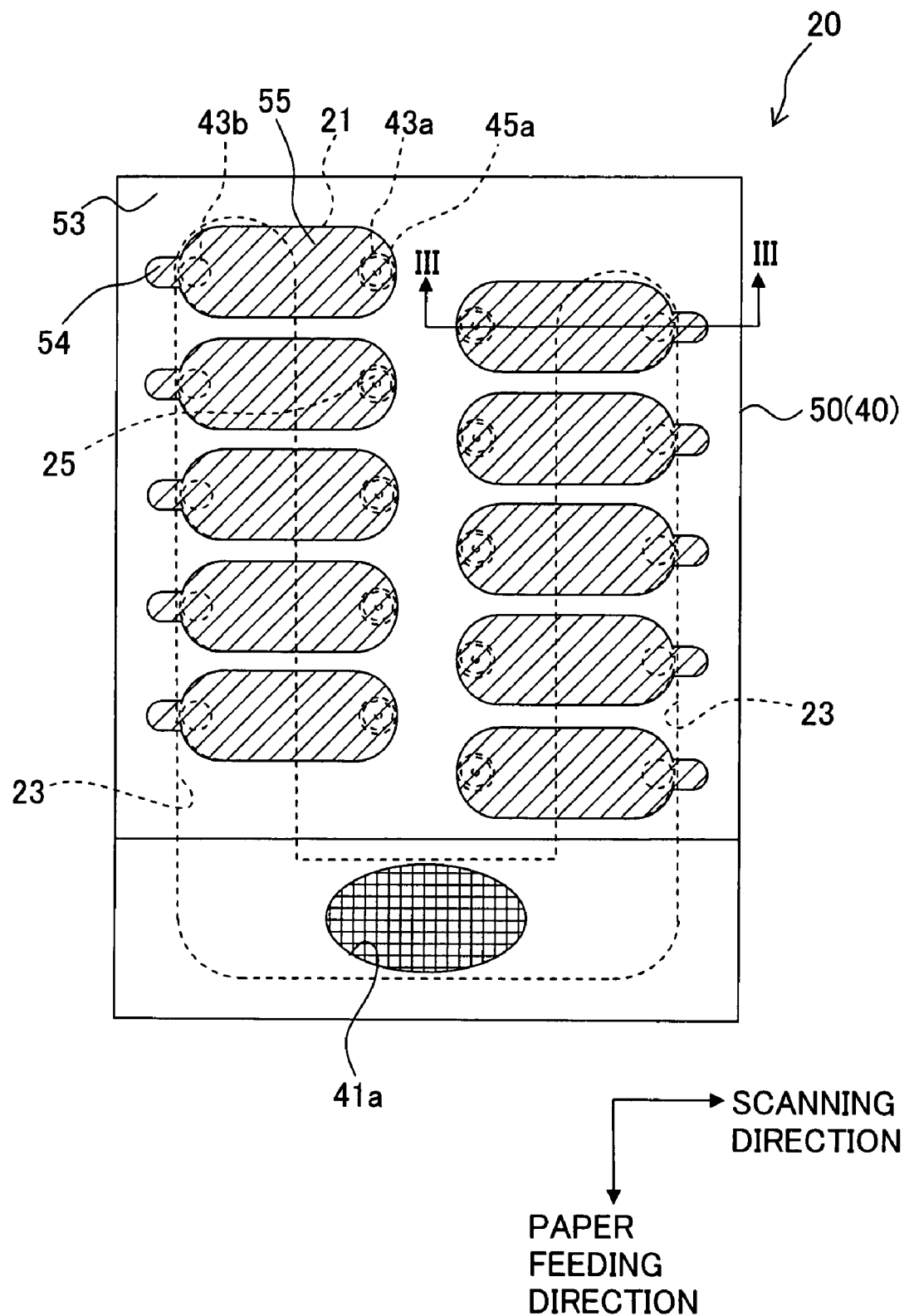
FIG. 2 is a top view of an ink-jet head shown in FIG. 1.
Figure 3:
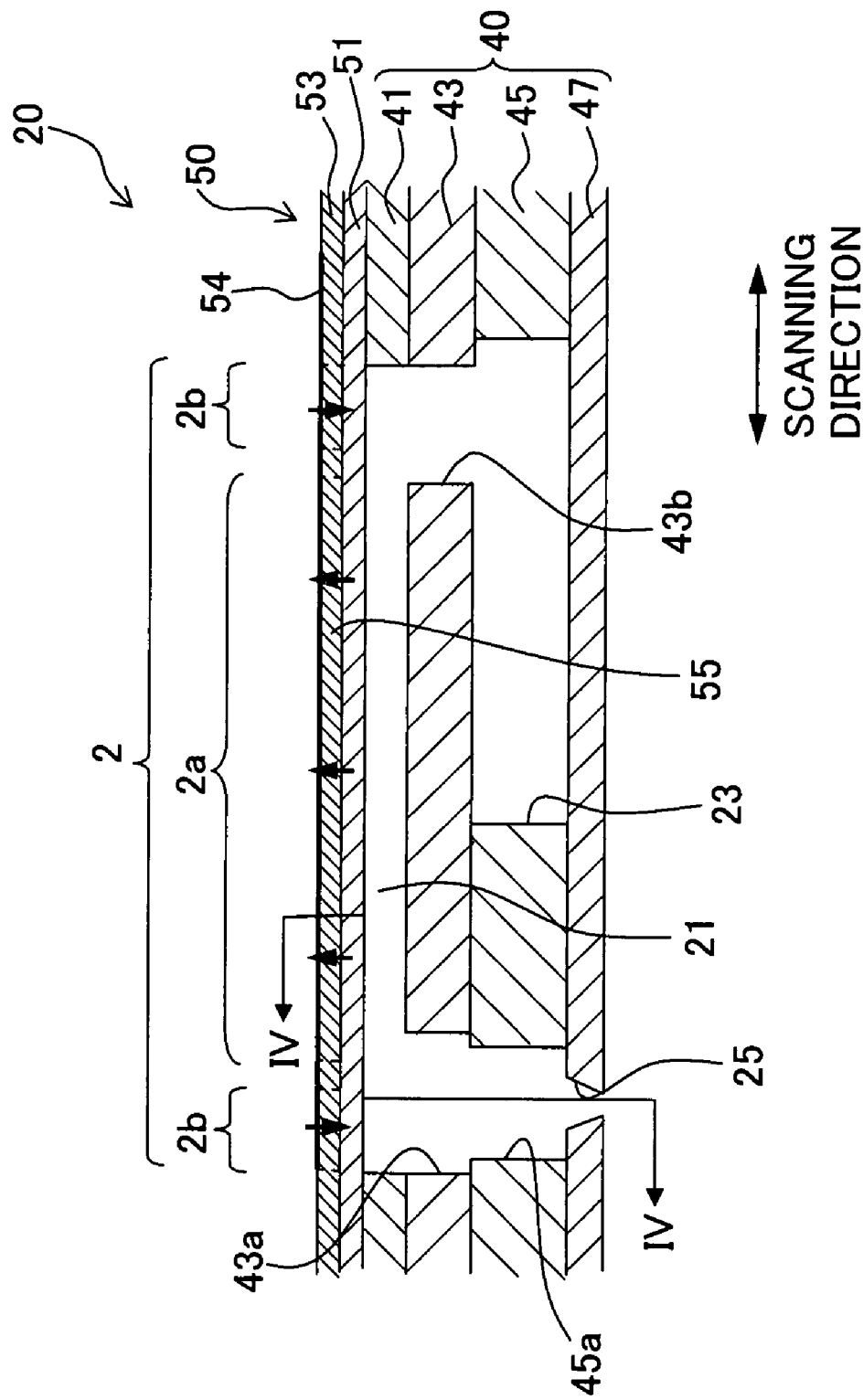
FIG. 3 is a cross-sectional view taken along a line III-III in FIG. 2.
Figure 4:
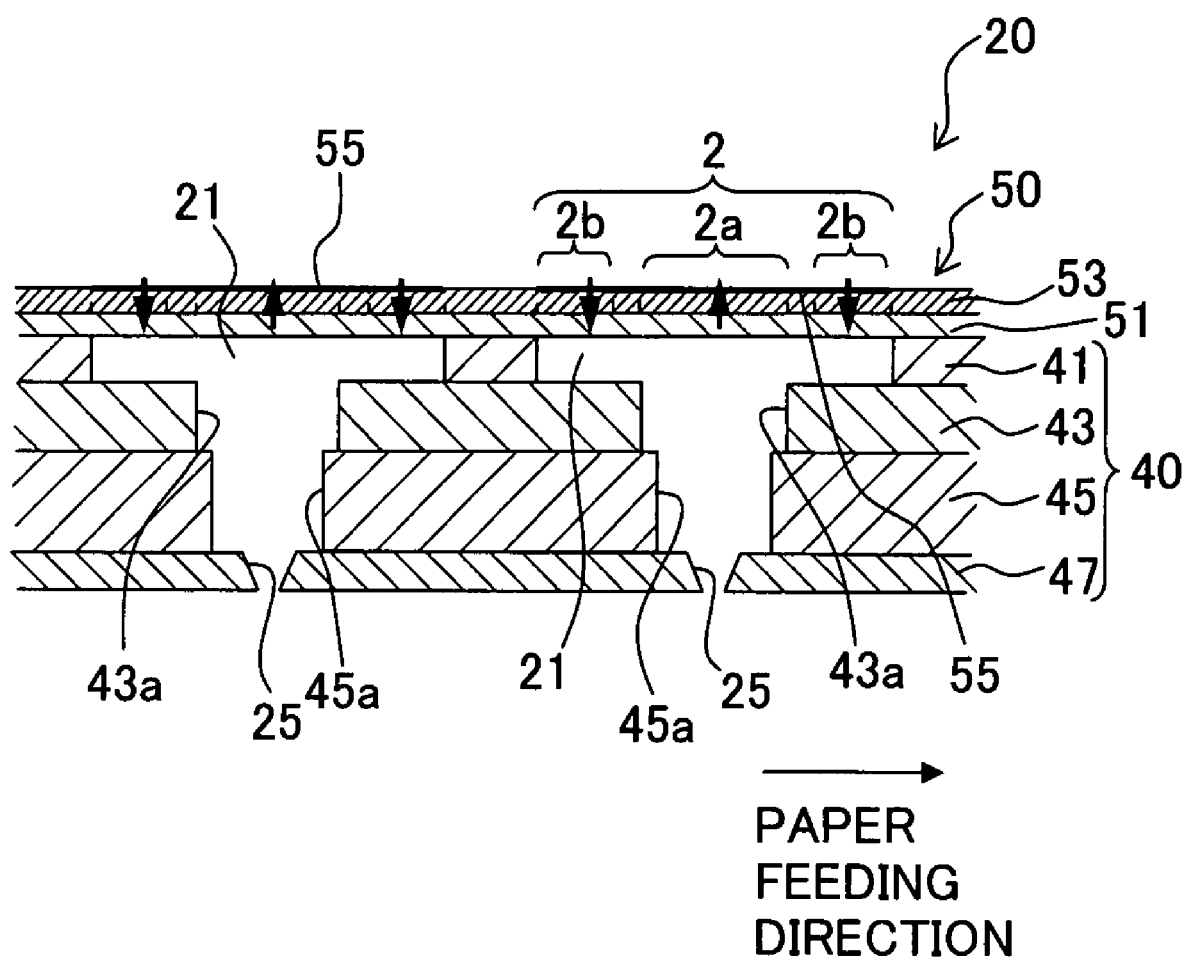
FIG. 4 is a cross-sectional view taken along a line IV-IV in FIG. 3.

Next, the ink-jet head 20 will be described below in detail with reference to FIGS. 2 to 4. FIG. 2 is a top view of the ink-jet head 20 (when viewed from a side opposite to a side facing the recording paper). Moreover, FIG. 3 is a cross-sectional view along a line III-III in FIG. 2. FIG. 4 is a cross-sectional view along a line IV-IV in FIG. 3.

As shown in FIGS. 2 to 4, the ink-jet head 20 includes a channel unit 40 in which individual ink channels including pressure chambers 21 are formed, and a piezoelectric actuator 50 which is stacked on an upper surface of the channel unit 40.

Here, the channel unit 40 will be described below. As shown in FIGS. 3 and 4, the channel unit 40 includes a cavity plate 41, a base plate 43, a manifold plate 45 and a nozzle plate 47, and these four plates are joined in a stacked state. The cavity plate 41, the base plate 43, and the manifold plate 45 are stainless steel plates. Furthermore, the nozzle plate 47 is formed of a high-molecular synthetic resin material such as polyimide, and is adhered to a lower surface of the manifold plate 45. Alternatively, the nozzle plate 47 may also be formed of a metallic material such as stainless steel similarly as the three plates 41, 43, and 45.

A plurality of pressure chambers 21 arranged along a plane is formed in the cavity plate 41. These pressure chambers 21 open toward a vibration plate 51 which will be described later (upper side in FIGS. 3 and 4). As shown in FIG. 2, the pressure chambers 21 are arranged in a staggered form (zigzag form) along the paper feeding direction. Each of the pressure chambers 21 is formed to be substantially elliptical shaped in a plan view, and is arranged such that a longitudinal direction (long-axis direction) thereof is in the scanning direction. Moreover, communicating holes 43a and 43b are formed in the base plate 43, at positions overlapping with both end portions in the longitudinal direction of the pressure chamber 21 in a plan view, as shown in FIGS. 2 and 3.

Two rows of manifolds 23 extended along the paper feeding direction are formed in the manifold plate 45, to overlap a right half portion of the pressure chambers 21 positioned on a right side in FIG. 2 and a left half portion of the pressure chambers 21 positioned on a left side in FIG. 2, in a plan view. The two rows of the manifolds 23 are connected mutually at one end portion thereof (lower end portion in FIG. 2). The ink is supplied to the manifolds 23 from an ink tank (not shown in the diagram), via an ink supply port 41a which is formed in the cavity plate 41. Moreover, also communicating holes 45a are formed in the manifold plate 45 at positions overlapping with an end portion of the pressure chamber 21, on a side opposite to a side overlapping with the manifold 23.

A plurality of nozzles 25 is formed in the nozzle plate 47, at positions overlapping with the end portion of the pressure chambers 21 in a plan view, on the side opposite to the side overlapping with the manifold 23. The nozzles 25 are formed in a substrate of a high-molecular synthetic resin material such as polyimide, by applying an excimer laser process.

As shown in FIG. 3, the manifold 23 communicates with the pressure chamber 21 via the communicating hole 43b, and furthermore, the pressure chamber 21 communicates with the nozzle 25 via the communicating holes 43a and 45a. In this manner, the plurality of individual ink channels (liquid channels) from the manifolds 23 up to the nozzles 25 via the pressure chambers 21 is formed in the channel unit 40.

Next, the piezoelectric actuator 50 will be described below. As shown in FIGS. 3 and 4, the piezoelectric actuator 50 includes the vibration plate 51, a piezoelectric material layer 53, and a plurality of individual electrodes 55. The vibration plate 51 is an electroconductive plate arranged on the upper surface (an upper surface of the cavity plate 41) of the channel unit 40. The piezoelectric material layer 53 is formed continuously on a surface of the vibration plate 51, over the pressure chambers 21. The individual electrodes 55 are formed on a surface of the piezoelectric material layer 53, on a side opposite to the vibration plate 51, corresponding to the pressure chambers 21 respectively.

The vibration plate 51 is a stainless steel plate, and has a shape same as of the plates 41 to 47, which form the channel unit 40. The vibration plate 51 is joined upon stacking on the upper surface of the cavity plate 41, closing the openings of the pressure chambers 21. Moreover, the vibration plate 51 also serves as a common electrode which generates an electric field in the piezoelectric material layer 53 between the individual electrode 55 and the vibration plate 51, facing the individual electrodes 55. The vibration plate 51 is kept at a ground electric potential all the time.

The piezoelectric material layer 53 which is composed of mainly lead zirconate titanate (PZT) which is a solid solution of lead titanate and lead zirconate is formed on the surface of the vibration plate 51. In the first embodiment, the piezoelectric material layer 53 is formed by using an aerosol deposition method (AD method) in which ultra fine particles of a piezoelectric material are collided to deposit at a high speed. It is also possible to use a method such as a sol-gel method, a sputtering method, a hydrothermal synthesis method, or a chemical vapor deposition method (CVD method) as a method for forming the piezoelectric material layer 53.

As shown in FIG. 2, the individual electrodes 55 having the same shape as the pressure chamber 21, in other words, the substantially elliptical shape, are formed on a surface of the piezoelectric material layer 53, at positions overlapping with the pressure chambers 21 in a plan view. In other words, the individual electrodes 55 and the pressure chambers 21 are facing mutually on an entire surface of the piezoelectric material layer 53. Here, the individual electrodes 55 are made of an electroconductive material such as gold. Moreover, terminal portions 54 are formed on the surface of the piezoelectric material layer 53, at one end portion of the individual electrodes 55 (an end portion on a side overlapping with the manifold 23 in a plan view). The terminal portions 54 are connected to a driving circuit such as a driver IC via a flexible wiring member such as a flexible printed circuit board, and a driving electric potential is selectively applied to the individual electrodes 55.

In the following description, a portion of the piezoelectric material layer 53 sandwiched between the vibration plate 51 and the individual electrode 55 is called as an 'active area 2' (in a description of a manufacturing process, a portion to be sandwiched between the vibration plate 51 and the individual 55, when the manufacturing is completed). In other words, the active area 2 of the piezoelectric material layer 53 has the same shape as the shape of the pressure chamber 21, and the pressure chamber 21 and the active area 2 of the piezoelectric material layer 53 are mutually facing over the entire surface of the piezoelectric material layer 53.

The piezoelectric material layer 53 is polarized in a direction of thickness. More particularly, as shown by arrows in FIGS. 3 and 4, a central portion 2a of the active area 2 is polarized upward (direction from the side of the vibration plate 51 toward the individual electrode 55), and an edge portion 2b of the active area 2, excluding the central portion 2a, is polarized downward (direction from a side of the individual electrode 55 toward the vibration plate 51). In other words, the central portion 2a and the edge portion 2b of the active area 2 are polarized in mutually opposite directions. In the first embodiment, the central portion 2a polarized upward and the edge portion 2b polarized downward are slightly isolated, and in this gap the piezoelectric material layer is not polarized.

Figure 5:
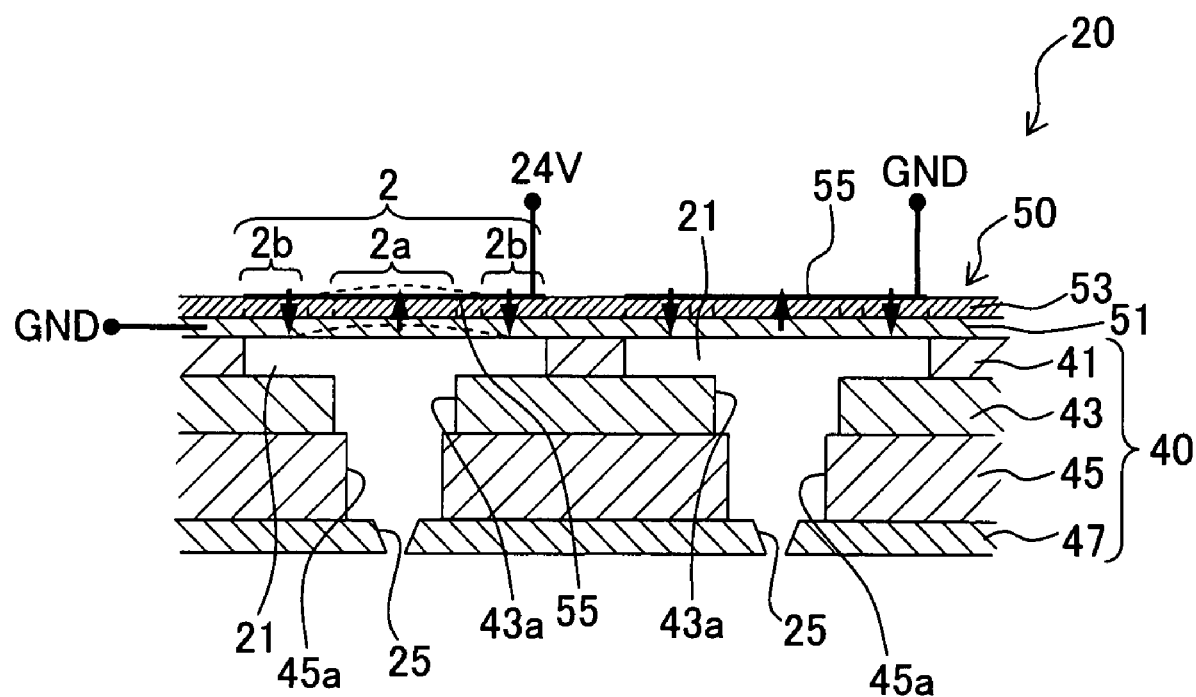
FIG. 5 is a diagram showing an operation of a piezoelectric actuator shown in FIG. 4.

Here, an action of the piezoelectric actuator 50 will be described below. As shown in FIG. 5, when a positive driving electric potential (24 V in the first embodiment) is selectively applied to the individual electrodes 55, there is a difference in the electric potential between the individual electrodes 55 to which the electric potential is applied and the vibration plate 51, and an electric field in a downward direction (a direction from the side of the individual electrodes 55 toward the vibration plate 51) is generated in the active area 2 of the piezoelectric material layer 53, corresponding to the individual electrode 55. At this time, since the central portion 2a of the active area 2 is polarized upward as described above, and the direction of the electric field and the direction of polarization are opposite directions, due to a piezoelectric transverse effect, the piezoelectric material layer 53 is extended in a horizontal direction which is orthogonal to the thickness direction corresponding to the direction of polarization. On the other hand, the edge portion 2b of the active area 2 is polarized downward as described above, and since the direction of the electric field and the direction of polarization are the same directions, the piezoelectric material layer 53 is contracted in the horizontal direction.

Moreover, due to the extension in the horizontal direction of the central portion 2a of the active area 2, a portion of the vibration plate 51, corresponding to the central portion 2a of the active area 2 is bent to form a projection toward an opposite side of the pressure chamber 21. On the other hand, another portion of the vibration plate 51, corresponding to the edge portion 2b of the active area 2 cannot be deformed at an end portion on a side which is joined to the channel unit 40. Therefore, due to the contraction in the horizontal direction of the edge portion 2b of the active area 2, an end portion of the location of the vibration plate 51, corresponding to the edge portion 2b of the active area 2, on a side opposite to the side which is joined to the channel unit 40 is bent to be displaced to the side opposite to the pressure chamber 21. Accordingly, as shown by a dashed line in FIG. 5, the portion corresponding to the active area 2, in other words, the portion of the piezoelectric actuator 50 corresponding to the pressure chambers 21, is bent to form a projection on the side opposite to the pressure chambers 21. As a result of this, a volume of the pressure chamber 21 is increased. Thereafter, when the drive voltage is stopped at a timing at which the pressure inside the pressure chamber 21 is changed from a negative pressure to a positive pressure, and the volume of the pressure chamber 21 is returned to the original volume, droplets of ink are jetted from the nozzle 25 communicating with the pressure chamber 21. In this manner, a pulling ejection is carried out in the ink-jet head 20 of the first embodiment.

Figure 6:
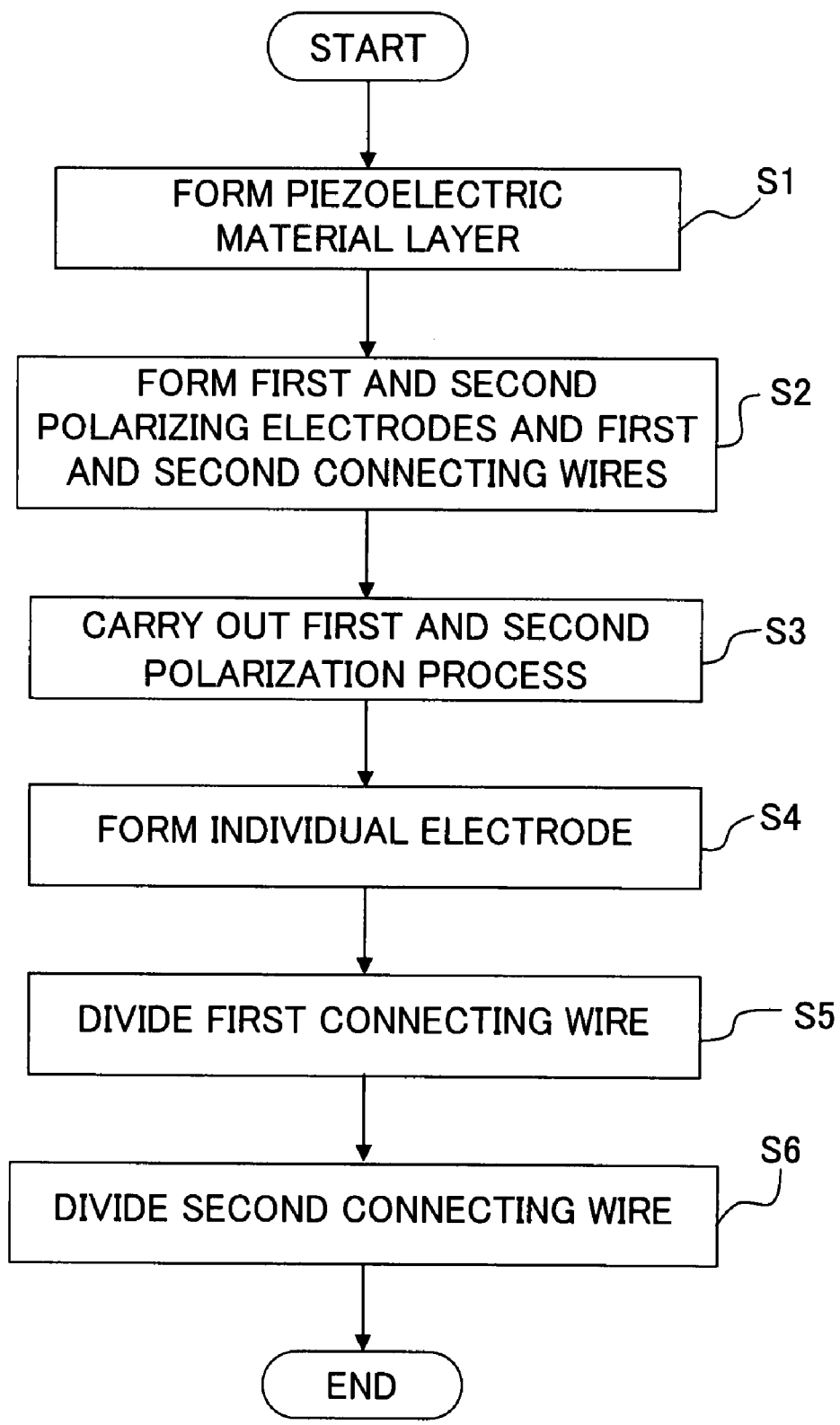
FIG. 6 is a flowchart showing a manufacturing process of the piezoelectric actuator shown in FIG. 3.

Next, an example of a manufacturing process of the piezoelectric actuator 50 will be described below with reference to FIGS. 6 to 10. FIG. 6 is a flow chart showing the manufacturing process of a piezoelectric actuator. FIGS. 7A to 10B show an ink-jet head in the manufacturing process of the piezoelectric actuator 50. FIGS. 7A, 8A, 9A, and 10A are diagrams showing a partial top view (when viewed from a side opposite to a side facing the recording paper), and FIGS. 7B, 8B, 9B, and 10B are diagrams showing a cross-sectional view.

Firstly, the piezoelectric material layer 53 is formed by the AD method on the surface of the vibration plate 51 which functions as a common electrode (Step S1: first electrode forming step). Next, in an area on a surface of the piezoelectric material layer 53 formed in step S1, on a side opposite to the vibration plate 51 (called as 'a surface of the piezoelectric material layer 53' in the description below), facing each active area 2 (in other words, an area corresponding to an area surrounded by a dashed lines showing the pressure chamber 21 in FIG. 7A), a plurality of first polarizing electrodes 61 and second polarizing electrodes 62 for polarizing the active area 2 are formed, and on the surface of the piezoelectric material layer 53, a first connecting wire 65 which connects the first polarizing electrodes 61, and a second connecting wire 66 which connects the second polarizing electrodes 62 are formed (step S2: first and second polarizing electrodes forming step, and first and second connecting wires forming step).

Figure 7A:
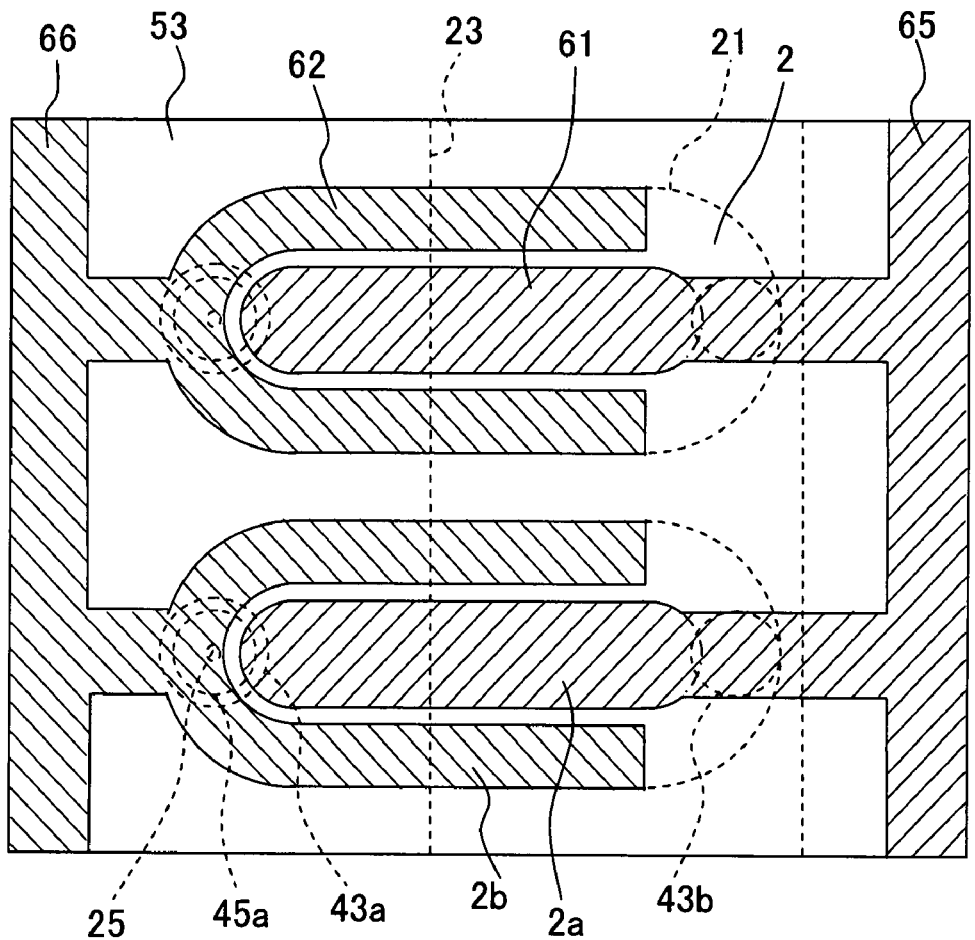
FIG. 7A and FIG. 7B are diagrams showing a step of forming first and second polarizing electrodes, and a step of forming first and second connecting wires, in the manufacturing process of the piezoelectric actuator shown in FIG. 3.
Figure 7B:
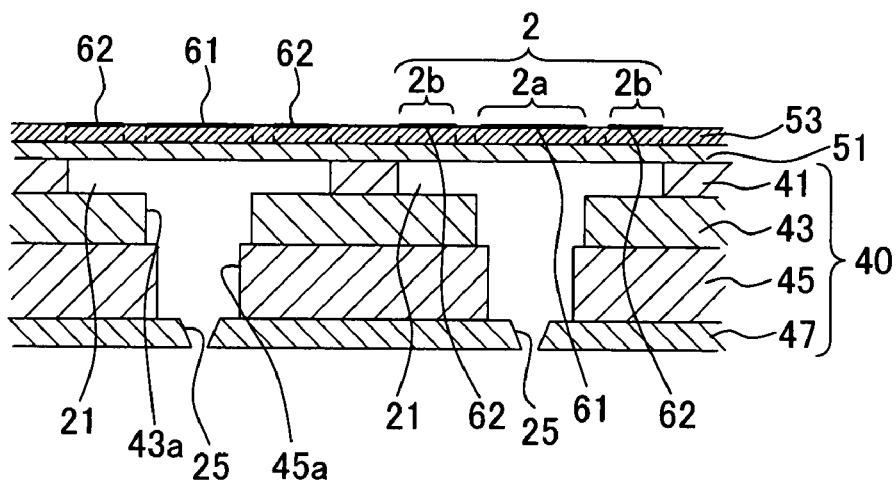

At this time, as shown in FIGS. 7A and 7B, the first polarizing electrodes 61 are formed, in the first polarizing electrode forming step, in an area (a first area 53a) on the surface of the piezoelectric material layer 53, corresponding to the central portion 2a of the active area 2. In other words, the first polarizing electrodes 61 are formed in an elliptical shaped area similar to the area, on the surface of the piezoelectric material layer 53. The second polarizing electrodes 62 formed in the second polarizing electrode forming step are formed in an area (a second area 53b) on the surface of the piezoelectric material layer 53, corresponding to the edge portion 2b of the active area 2. In other words, the second polarizing electrodes 62 are formed in a substantially U-shaped area along an edge of the area, on the surface of the piezoelectric material layer 53. A gap of about 15 μm to 20 μm is formed between the first polarizing electrodes 61 and the second polarizing electrodes 62.

Moreover, the first connecting wire 65 formed in the first connecting wire forming step is formed to be connected to one end portion in a longitudinal direction of the substantially elliptical shaped first polarizing electrode 61 (right side end portion in FIG. 7A). The second connecting wire 66 formed in the second connecting wire forming step is formed to be connected to a bent portion of the U-shaped second polarizing electrode 62 (left side end portion in FIG. 7A). Each of a boundary between the first polarizing electrode 61 and the first connecting wire 65 and a boundary between the second polarizing electrode 62 and the second connecting wire 66 is shown by an alternate long and short dash line. In the first embodiment, the first polar electrode 61 and the second polar electrode 62, and the first connecting wire 65 and the second connecting wire 66 are formed at the same time, by screen printing.

Figure 8A:
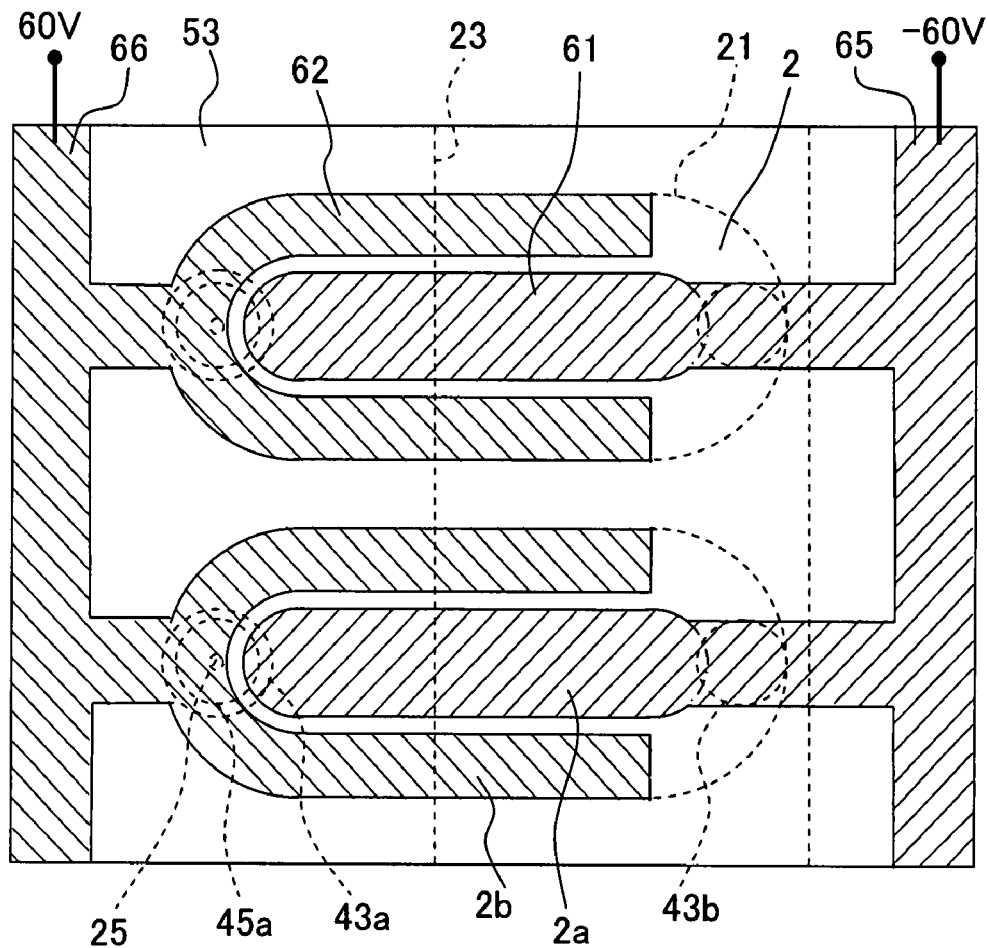
FIG. 8A and FIG. 8B are diagrams showing steps of first and second polarization in the manufacturing process of the piezoelectric actuator shown in FIG. 3.
Figure 8B:
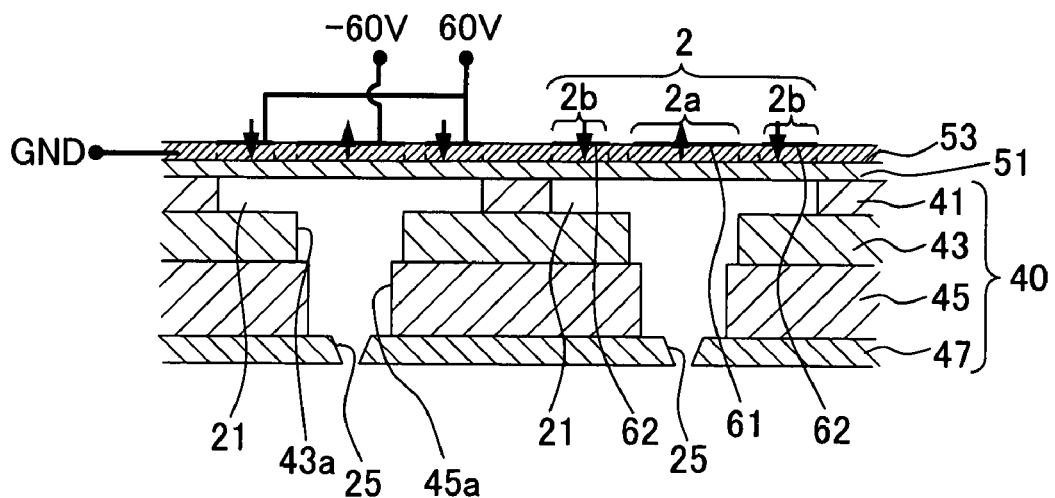

Next, as shown in FIGS. 8A and 8B, an electric potential of the first polarizing electrode 61 is set to be −60 V. At this time, an electric field in an upward direction (a direction from the side of the vibration plate 51 toward the first polarizing electrode 61) is applied to the central portion 2a of the piezoelectric material layer 53, sandwiched between first polarizing electrode 61 and the vibration plate 51 which is kept at the ground electric potential (a first polarization process). Furthermore, when an electric potential of the second polarizing electrode 62 is set to be 60 V, an electric field in a downward direction (direction from the side of the second polarizing electrode 62 toward the vibration plate 51) is applied to the edge portion 2b of the piezoelectric material layer 53, sandwiched between the second polarizing electrode 62 and the vibration plate 51 (a second polarization process) (step S3). Accordingly, as shown in FIG. 8B, the central portion 2a of the active area 2, on which the electric field in the upward direction acts is polarized in the upward direction, and the edge portion 2b of the active area 2, on which the electric field in the downward direction acts is polarized in the downward direction.

Figure 9A:
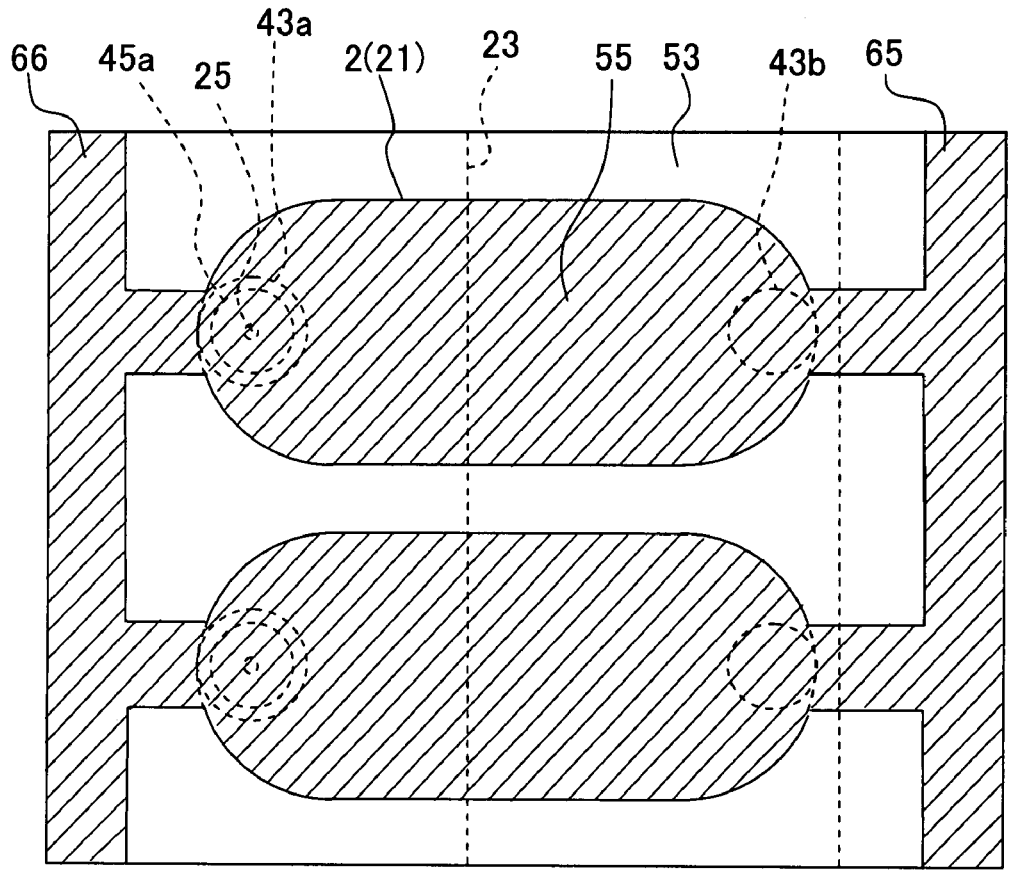
FIG. 9A and FIG. 9B are diagrams showing a step of forming a second electrode in the manufacturing process of the piezoelectric actuator shown in FIG. 3.
Figure 9B:
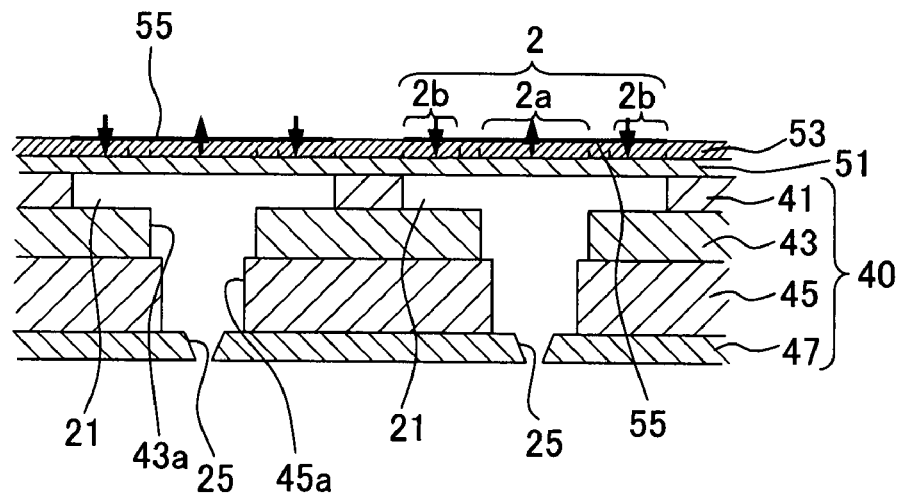

Moreover, as shown in FIGS. 9A and 9B, the individual electrodes 55 are formed in an entire area on the surface of the piezoelectric material layer 53, corresponding to the active area 2 (step S4: second electrode forming step). At this time, since the first polarizing electrodes 61, the second polarizing electrodes 62, and a part of the first connecting wire 65 are formed in a portion of a corresponding area (area corresponding to the active area 2) on the surface of the piezoelectric material layer 53, electrodes are formed in a residual portion of the corresponding area, the residual portion being an area in which the first polarizing electrode 61, the second polarizing electrode 62, and the first connecting wire 65 are not formed. Consequently, the electrodes are formed in the entire corresponding area (area corresponding to the active area 2). The electrodes may also be formed to overlap with the first polarizing electrode 61, the second polarizing electrode 62, and the first connecting wire 65.

Figure 10A:
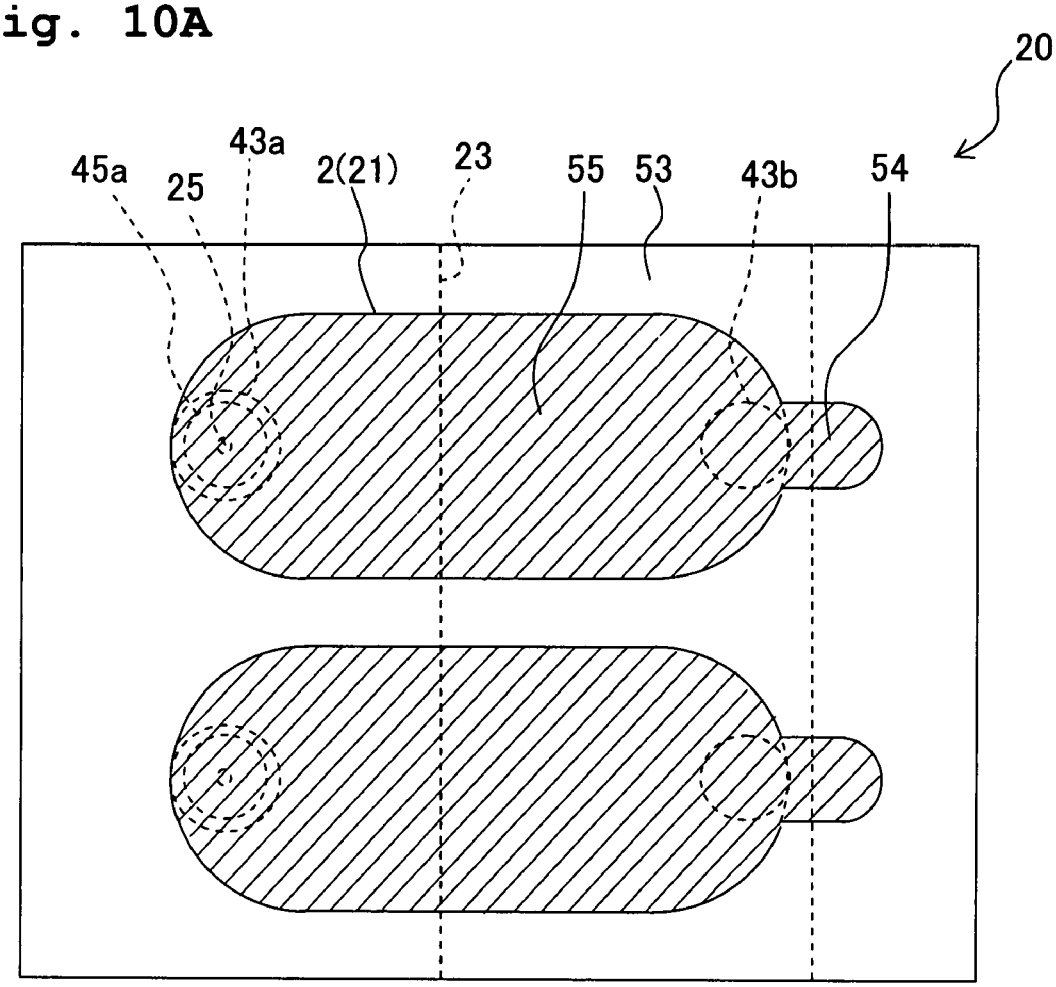
FIG. 10A and FIG. 10B are diagrams showing a step of dividing first and second connecting wires in the manufacturing process of the piezoelectric actuator shown in FIG. 3.
Figure 10B:
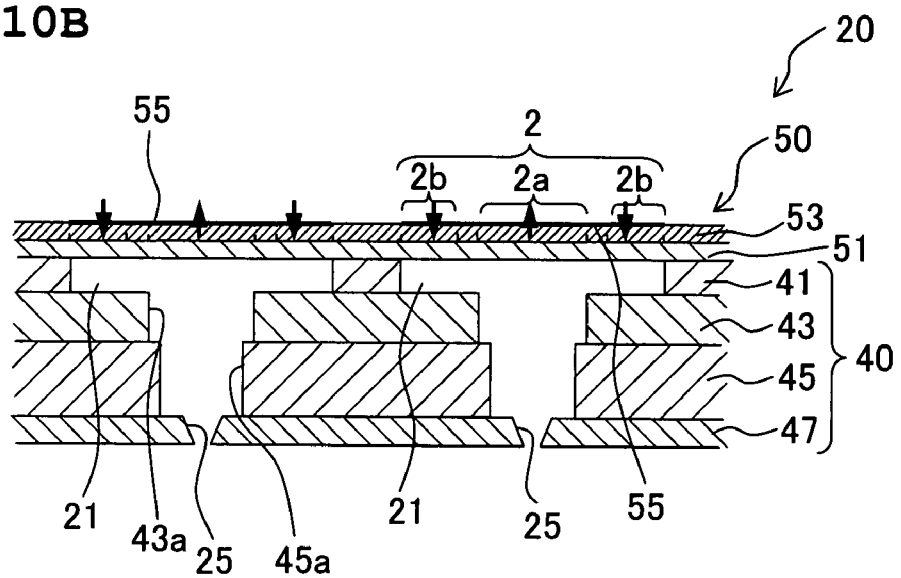

Thereafter, the first connecting wire 65 is divided, and the connections between the individual electrodes 55 by the first connecting wire 65 are cut off (step S5: first connecting wire dividing step). As shown in FIGS. 10A and 10B, in the first embodiment, the first connecting wire 65 is removed, except for a part of the individual electrode 55 formed in the corresponding area (area corresponding to the active area 2), and a portion which becomes the terminal portion 54 formed at the one end (right end in the diagram) in the longitudinal direction of the individual electrode 55. Finally, the second connecting wire 66 is divided, and the connections between the individual electrodes 55 by the second connecting wire 66 are cut off (step S6: second connecting wire dividing step). As shown in FIGS. 10A and 10B, in the first embodiment, the entire second connecting wire 66 is removed. However, a portion of the second connecting wire 66 may be removed so that the individual electrodes 55 are disconnected. In steps S5 and S6, the first connecting wire 65 and the second connecting wire 66 are removed by irradiating laser rays, or by grinding for example. Accordingly, as shown in FIG. 10A, the individual electrodes 55 which are independent, are formed electrically in a plurality of corresponding areas on the surface of the piezoelectric material layer 53, corresponding to the active area 2.

The abovementioned procedure is one example, and can be changed appropriately. For example, each step in steps S1 to S3 may be carried out in any order provided that the first polarization step is carried out after the first polarizing electrode forming step and the first electrode forming step; and the second polarization step is carried out after the second polarizing electrode forming step and the first electrode forming step. For example, each of the four steps namely the first and the second polarizing electrode forming steps, and the first and the second connecting wire forming steps in step S2 may be carried out separately. Or, each of the two steps namely the first polarization step and the second polarization step in step S3 may be carried out separately. In this case, at the time of the first and second polarization steps, it is possible to avoid a generation of an electrical discharge between the first polarizing electrode 61 and the second polarizing electrode 62, by applying simultaneously different electric potentials to the first polarizing electrode 61 and the second polarizing electrode 62.

Moreover, in the abovementioned procedure, only a manufacturing procedure of the piezoelectric actuator 50 is described, and a manufacturing procedure of the ink-jet head 20 including the channel unit 40 is not in question. In other words, in FIGS. 7A to 10B showing the manufacturing process, a state in which the vibration plate 51 is joined to the channel unit 40 is shown. However, for example, the piezoelectric actuator 50 may be manufactured with the vibration plate 51 and the channel unit 40 not joined, and thereafter may be joined to the channel unit 40. Alternately, the piezoelectric actuator 50 may be manufactured with the vibration plate 51 joined to the incomplete channel unit 40 (for example, the nozzle plate 47 is not yet joined), and thereafter the channel unit 40 may be completed.

As it has been mentioned above, in the first embodiment, the first polarizing electrode 61 is formed in the first area 53a on the surface of the piezoelectric material layer 53, corresponding to the central portion 2a of the active area 2, and the second polarizing electrode 62 is formed in the second area 53b on the surface of the piezoelectric material layer 53, corresponding to the edge portion 2b of the active area 2. Next, the central portion 2a in the active area 2 is polarized upward by applying the electric potential in the upward direction between the first polarizing electrode 61 and the vibration plate 51 which is kept at the ground electric potential. Furthermore, the edge portion 2b in the active area 2 is polarized downward by applying the electric potential in the downward direction between the second polarizing electrode 62 and the vibration plate 51. Thereafter, the individual electrodes 55 are formed, on the surface of the piezoelectric material layer 53, in the entire corresponding area corresponding to the active area 2. Consequently, when the electric field is applied in the active area 2 by applying the driving electric potential to the individual electrode 55, extension and contraction characteristics of the central portion 2a and the edge portion 2b of the active area 2, along the direction orthogonal to the direction of the electric field are reversed. In other words, the central portion 2a is extended and the edge portion 2b is contracted. As a result of this, a portion corresponding to the active area 2 in the piezoelectric actuator 50, in other words, the central portion 2a and the edge portion 2b facing the pressure chamber 21 is bent spontaneously in mutually reverse direction along the thickness direction thereof. Accordingly, only the central portion facing the pressure chamber 21 is bent spontaneously, and as compared to a case in which the edge portion is bent upon being dragged by the central portion, it is possible to deform substantially the piezoelectric actuator 50. As a result of this, even when the drive voltage is low, it is possible to impart sufficient amount of deformation to the piezoelectric actuator 50, for jetting the ink from the nozzles 25. Concretely, by reversing the direction of polarization in the central portion 2a and the edge portion 2b of the active area 2, it is possible to have the same amount of deformation even when a voltage lower by approximately 40% is applied, as compared to a conventional piezoelectric actuator in which the central portion and the edge portion are polarized in the same direction. For example, in the conventional piezoelectric actuator, for a case in which it is necessary to apply a voltage of 40 V for having a predetermined amount of deformation, in the piezoelectric actuator 50 of the first embodiment, a voltage of 24 V may be applied to have the same amount of deformation.

Moreover, in the present invention, the vibration plate 51 is electroconductive, and also serves as the common electrode. Consequently, a step of forming the piezoelectric material layer 53 on the surface of the vibration plate 51 is equivalent to the first electrode forming step of forming the common electrode. Accordingly, since it is not necessary to provide separately the first electrode formation step apart from the step of forming the piezoelectric material layer 53 on the surface of the vibration plate 51, it is possible to reduce the number of steps.

Furthermore, in the first embodiment, the first polarizing electrode 61 and the second polarizing electrode 62 are formed to be mutually isolated, and the first polarization step and the second polarization step are carried out simultaneously. Consequently, it is possible to reduce time required for the manufacturing process as compared to a case in which the first polarization step and the second polarization step are carried out separately.

Moreover, in the first embodiment, the first polarizing electrode forming step and the second polarizing electrode forming step are carried out simultaneously, and the first connecting wire forming step and the second connecting wire forming step are also carried out simultaneously. Consequently, it is possible to reduce time required for the manufacturing process as compared to a case in which the first polarizing electrode forming step and the second polarizing electrode forming step, and the first connecting wire forming step and the second connecting wire forming step are carried out separately.

Furthermore, in the first embodiment, the first connecting wire 65 which connects the first polarizing electrodes 61 formed in the corresponding area on the surface of the piezoelectric material layer 53, corresponding to the plurality of active portions 2; and the second connecting wire 66 which connects the second polarizing electrodes 62 are formed before carrying out the first polarization step and the second polarization step in step S3. Moreover, after the first polarization step and the second polarization step in step S3 are carried out, then the individual electrodes 55 in the area of the piezoelectric material layer 53, corresponding to the active area 2 are formed, and then, the connections between the individual electrodes 55 are disconnected by dividing the first connecting wire 65 and the second connecting wire 66. Consequently, it is possible to connect the first polarizing electrodes 61 and the second polarizing electrodes 62 easily as compared to a case in which the first polarizing electrodes 61 are connected by a wiring cable and the second polarizing electrodes 62 are connected by a wiring cable.

Moreover, in the first embodiment, the first connecting wire dividing step of dividing the first connecting wire 65 and the second connecting wire dividing step of dividing the second connecting wire 66 are carried out after the second electrode forming step of forming the individual electrodes 55 in the step S4. In a case of removing only a part of the first connecting wire 65 and the second connecting wire 66 in the connecting wire dividing step, and forming the individual electrodes 55 thereafter, it might make contact and get shorted between the individual electrodes 55 and the remaining portion of the first connecting wire 65 and/or between the individual electrodes 55 and the second connecting wire 66, due to blurring of an edge of the individual electrode 55. However, according to the abovementioned structure, even in a case of removing only a part of the first connecting wire 65 and the second connecting wire 66 in the first connecting wire dividing step and the second connecting wire dividing step, since there is no contact between the individual electrode 55 and the remaining part of the first connecting wire 65, and between the individual electrode 55 and the remaining part of the second connecting wire 66, it is possible to prevent from getting shorted between the individual electrodes 55 and the remaining portion of the first connecting wire 65 and between the individual electrodes 55 and the second connecting wire 66.

Moreover, in the first embodiment, the central portion 2a of the active area 2 is polarized in the upward direction, and the edge portion 2b of the active area 2 is polarized in the downward direction. When the electric field in the downward direction is applied to the active area 2 by applying the driving potential to the individual electrode 55, the central portion 2a of the active area 2 is extended in the orthogonal direction orthogonal to the direction of the electric field, and the edge portion 2b of the active area 2 is contracted in the orthogonal direction. Consequently, a portion, of the piezoelectric actuator 50, corresponding to the central portion 2a is projected toward a side opposite to the pressure chamber 21, and another portion, of the piezoelectric actuator 50, corresponding to the edge portion 2b is bent such that an end portion of the edge portion 2b is displaced toward the side opposite to the pressure chamber 21, the end portion being opposite to the other end portion which is connected to the channel unit 40. Therefore, it is possible to increase the volume of the pressure chamber 21. Accordingly, it is possible to realize a pulling ejection. Since it is possible to keep the individual electrodes 55 at the ground electric potential when the ink is not jetted from the nozzle 25, it is possible to prevent deterioration of the piezoelectric material layer 53, and reliability of operation of the piezoelectric actuator 50 is improved. In the first embodiment, the second polarizing electrode 62 is formed to be substantially U-shaped. The edge portion 2b of the piezoelectric material layer 53 is not polarized along the entire circumference thereof, and one end portion in the longitudinal direction of the pressure chamber 21 is not polarized. Therefore, the portion which is not polarized does not contribute to the deformation of the piezoelectric actuator 50. However, as in the first embodiment, when the pressure chamber 21 is long in one direction (longitudinal direction, long-axis) in a plan view, since an end portion in a long-axis direction is not deformed as easily as an end portion in a short-axis direction, there is not much effect on the amount of deformation of the entire piezoelectric actuator 50. In other words, as in the first embodiment, when the pressure chamber 21 is long in one direction in a plan view, it is possible to deform the piezoelectric actuator 50 sufficiently, provided that a portion near the end portion in the short-axis direction, out of the edge portion 2b of the piezoelectric material layer 53 is kept polarized.

Figure 11:
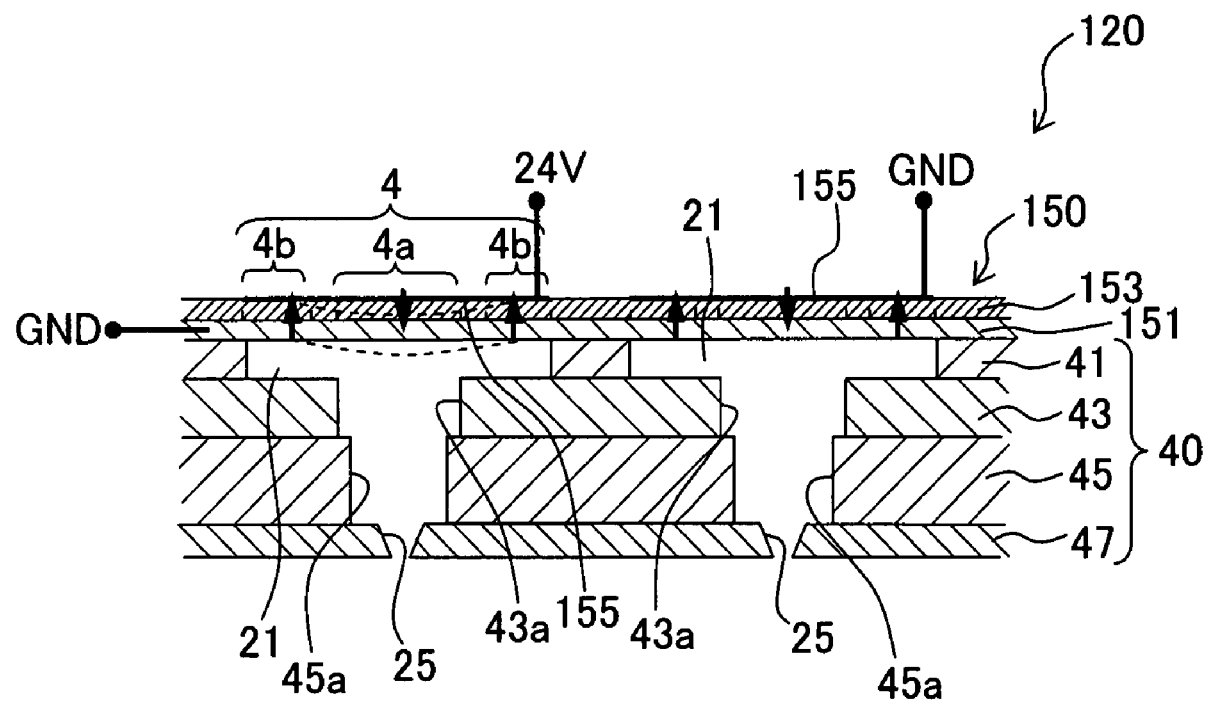
FIG. 11 is a cross-sectional view of an ink-jet head according to a modified embodiment of the first embodiment.

Here, a modified embodiment of the first embodiment will be described with reference to FIG. 11. FIG. 11 is a cross-sectional view of an ink-jet head according to the modified embodiment, and corresponds to FIG. 5 of the first embodiment. This modified embodiment is a modified embodiment in which a direction of polarization of the active area 2 of the piezoelectric material layer 53 in the first embodiment is changed.

As shown in FIG. 11, a central portion 4a in an active portion 4 of a piezoelectric material layer 153 is polarized downward, and an edge portion 4b in the active portion 4 is polarized upward. Consequently, when a positive driving electric potential is selectively applied to a plurality of individual electrodes 155, with a vibration plate 151 kept at the ground electric potential, an electric field in a downward direction is generated in the active portion 4 of the piezoelectric material layer 153. At this time, since the direction of polarization of the central portion 4a of the active portion 4, corresponding to the individual electrode 155 to which the electric potential is applied, is same as the direction of the electric field, the central portion 4a is contracted in a horizontal direction which is orthogonal to the direction of polarization (thickness direction of the piezoelectric material layer 153). On the other hand, since the direction of polarization of the edge portion 4b of the active portion 4 is opposite to the direction of the electric field, the edge portion 4b is extended in the horizontal direction which is orthogonal to the direction of polarization.

Moreover, since the central portion 4a of the active portion 4 is contracted in the horizontal direction, a certain portion of the vibration plate 151 corresponding to the central portion 4a of the active portion 4 is bent to form a projection toward the pressure chamber 21. On the other hand, another portion of the vibration plate 151 corresponding to the edge portion 4b of the active portion 4 has an end portion (first end portion 151a) which is joined to the channel unit 40, and the other end portion (second end portion 151b) on a side opposite to a side joined to the channel unit 40. Here, when the edge portion 4b of the active portion 4 is extended in the horizontal direction, a portion of the vibration plate 151 near the first end portion 151a is joined to the channel unit 40 and cannot be deformed, but a portion of the vibration plate 151 near the second end portion 151b is bent toward the pressure chamber 21. In other words, as shown by dashed lines in FIG. 11, a portion of the piezoelectric actuator 150, corresponding to the active portion 4, in other words, the portion facing the pressure chamber 21 is bent to form a projection toward the pressure chamber 21. Accordingly, the volume of the pressure chamber 21 is decreased, and a jetting pressure is applied to the ink in the pressure chamber 21, and the droplets of the ink are jetted from the nozzle 25 communicating with the pressure chamber 21. In this manner, in an ink-jet head 120 which includes the piezoelectric actuator 150 of the modified embodiment, a pushing ejection is carried out.

According to this modified embodiment, similarly as in the first embodiment, even when the drive voltage is low, it is possible to impart to the piezoelectric actuator 150, an amount of deformation which is sufficient for jetting the ink from the nozzles 25.

Second Embodiment

Figure 12:
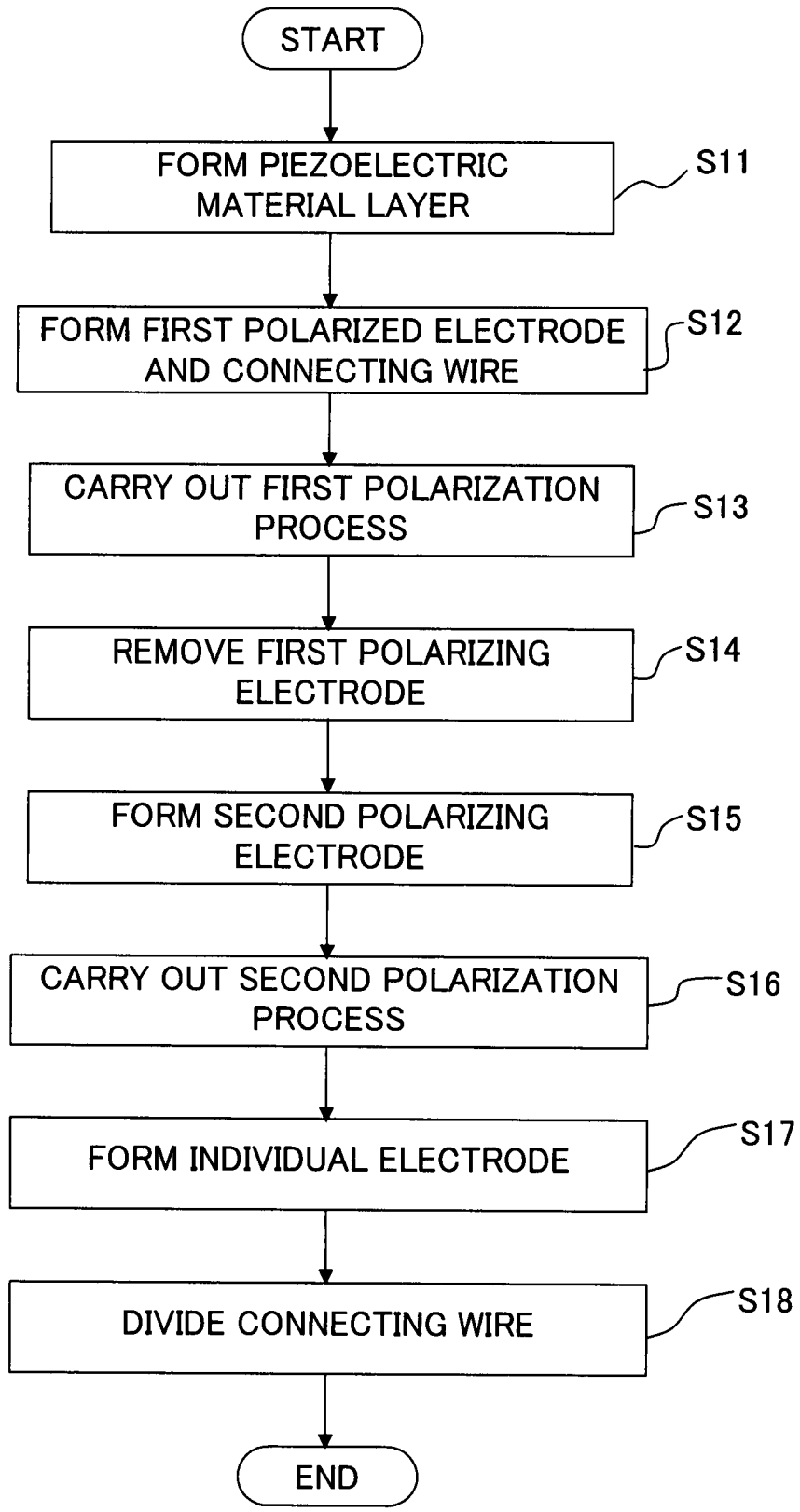
FIG. 12 is a flowchart showing a manufacturing process of a piezoelectric actuator according to a second embodiment of the present invention.

Next, a second embodiment of the present invention will be described below with reference to FIGS. 12 to 17B. FIG. 12 is a flowchart showing a manufacturing process of a piezoelectric actuator of the second embodiment. FIGS. 13A to 17B, show an ink-jet head in the manufacturing process of the piezoelectric actuator. FIGS. 13A, 14A, 15A, 16A, and 17A are diagrams showing a partial top view (when viewed from a side opposite to a side facing the recording paper), and FIGS. 13B, 14B, 15B, 16B, and 17B are diagrams showing a cross-sectional view.

The second embodiment is similar to the first embodiment except for a structure of a piezoelectric actuator 250. The main point of difference between the structure of the piezoelectric actuator 250 according to the second embodiment and the structure of the piezoelectric actuator 50 according to the first embodiment is as described below. In the piezoelectric actuator 50, the central portion 2a and the edge portion 2b in the active area 2 of the piezoelectric material layer 53, which are polarized in the mutually opposite direction, are isolated, and there is a portion in this gap which is not polarized. Whereas in the piezoelectric actuator 250, a central portion 6a and an edge portion 6b which are polarized in the mutually opposite direction in an active portion 6 of a piezoelectric material layer 253 are formed without a gap between the central portion 6a and the edge portion 6b. In the following description, same reference numerals are assigned to components which have a structure similar to that in the first embodiment, and the description of such components is omitted appropriately.

Figure 17A:
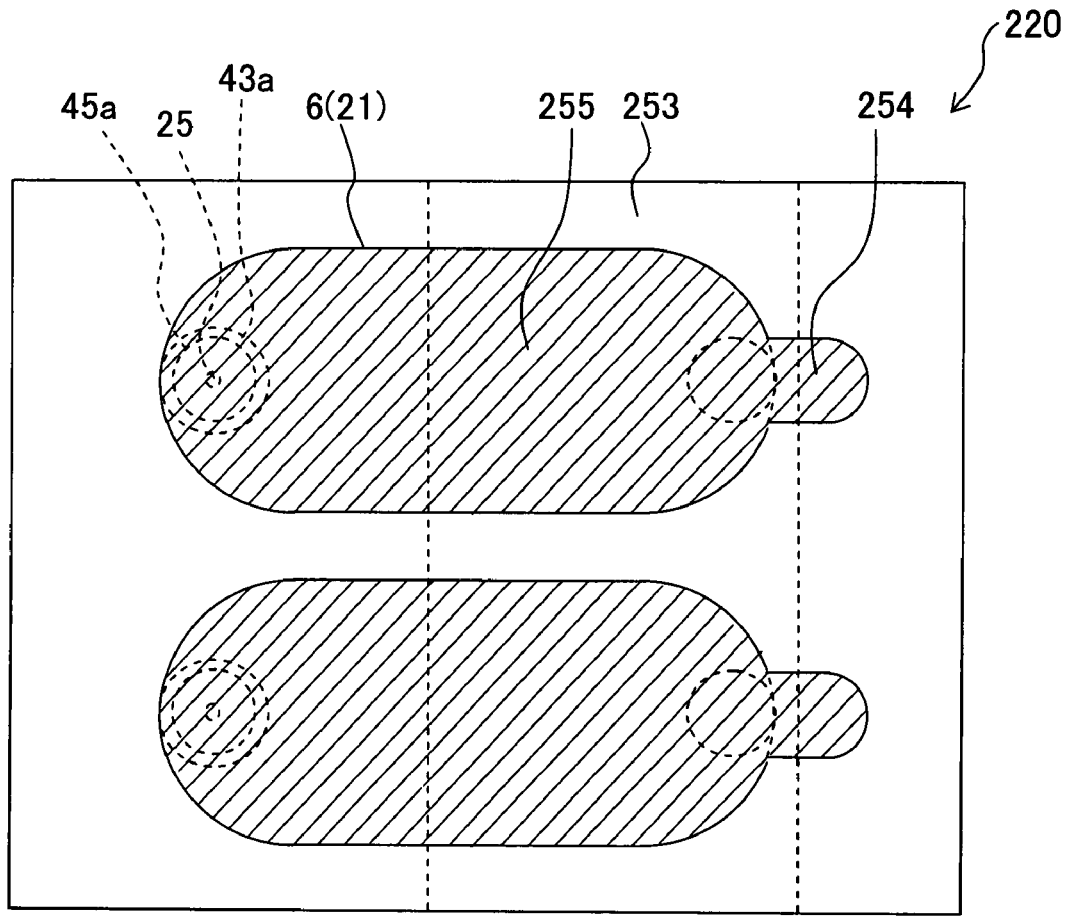
FIG. 17A and FIG. 17B are diagrams showing a step of dividing a connecting wire in the manufacturing process of the piezoelectric actuator of the second embodiment.
Figure 17B:
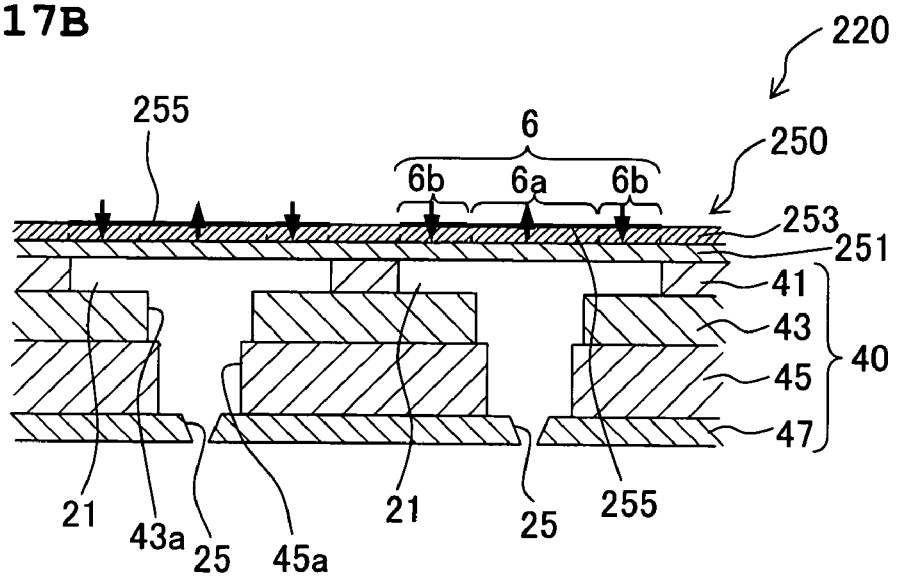

FIGS. 17A and 17B indicate a finished state of the piezoelectric actuator 250. As shown in FIGS. 17A and 17B, in the piezoelectric actuator 250 of the second embodiment, similarly as in the first embodiment, the central portion 6a in the active portion 6 of the piezoelectric material layer 253 is polarized upward, and the edge portion 6b in the active portion 6 is polarized downward. Moreover, the central portion 6a which is polarized upward and the edge portion 6b which is polarized downward are formed without a gap between the two (without being isolated). Consequently, when a positive driving electric potential is applied to an individual electrode 255, and an electric field in a downward direction is applied to the active portion 6, a portion of the piezoelectric actuator 250, corresponding to the active portion 6, in other words, a portion facing the pressure chamber 21, is bent to form a projection on a side opposite to the pressure chamber 21.

Next, an example of a manufacturing process of the piezoelectric actuator of the second embodiment will be described below.

Firstly, the piezoelectric material layer 253 is formed by the AD method on a surface of a vibration plate 251 which functions as a common electrode (step S11: first electrode forming step). Next, in a central portion of an area (corresponding area) corresponding to each active portion 6 on a surface of the piezoelectric material layer 253 formed in step S11, a first polarizing electrode 261 for polarizing the active portion 6 of the piezoelectric material layer 253 is formed, as well as a connecting wire 265 which connects the first polarizing electrodes 261 is formed in the corresponding area (step S12: first polarizing electrode forming step and connecting wire forming step). In the second embodiment, the first polarizing electrode 261 and the connecting wire 265 are formed at the same time, by the screen printing.

Figure 13A:
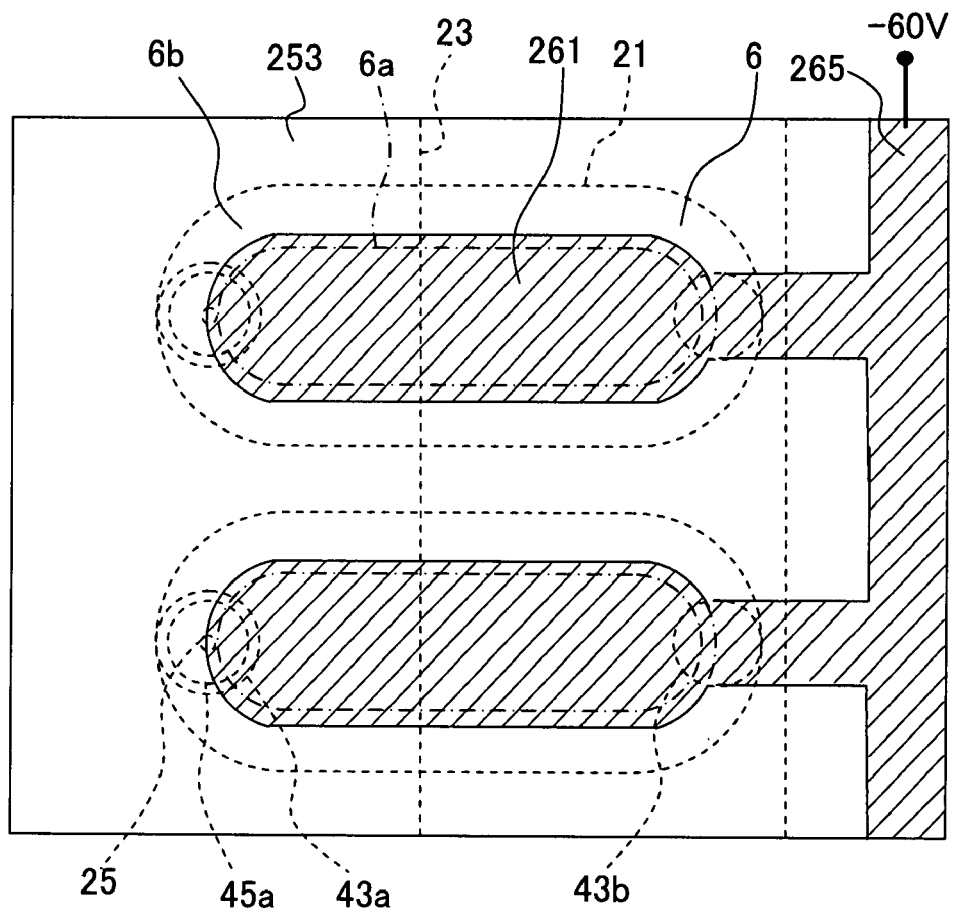
FIG. 13A and FIG. 13B are diagrams showing a step of first polarization in the manufacturing process of the piezoelectric actuator of the second embodiment.
Figure 13B:
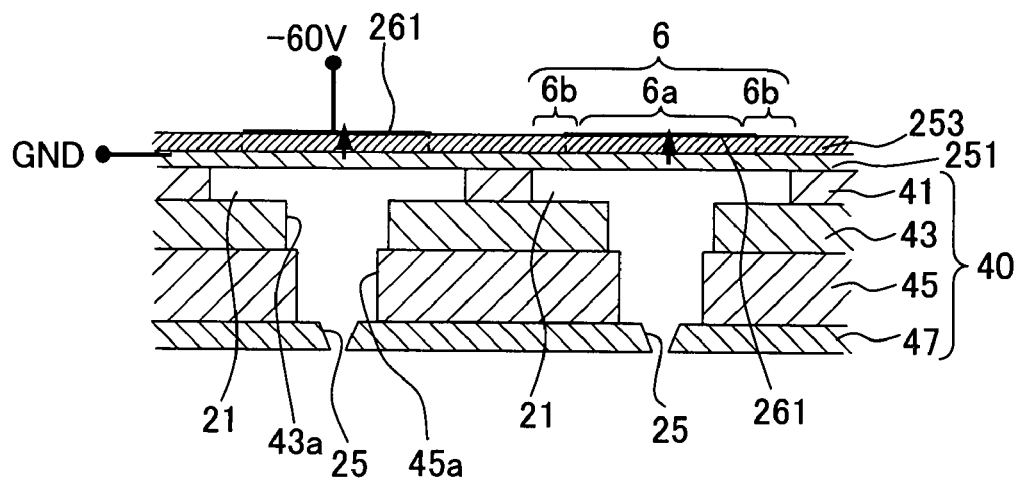

As shown in FIGS. 13A and 13B, the first polarizing electrode 261 is formed, in the first polarizing electrode forming step, in an area slightly larger than a central portion in an area corresponding the active portion 6 of the piezoelectric material layer 253. More particularly, the first polarizing electrode 261 is formed in an area slightly larger than an area which is polarized upward (area, of the piezoelectric material layer 253, corresponding to the central portion 6a; substantially elliptical area surrounded by alternate long and two short dashes line in FIG. 13A), in the finished piezoelectric actuator 250. Moreover, the connecting wire 265 is formed, in the connecting wire forming step, to be connected to an end portion in a longitudinal (long-axis) axial direction of the substantially elliptical shaped first polarizing electrode 261 (end portion at right side in FIG. 13A). In FIG. 13A, a boundary between the first polarizing electrode 261 and the connecting wire 265 is shown by an alternate long and short dash line. The first polarizing electrode 261 and the connecting wire 265 are formed at the same time.

Figure 14A:
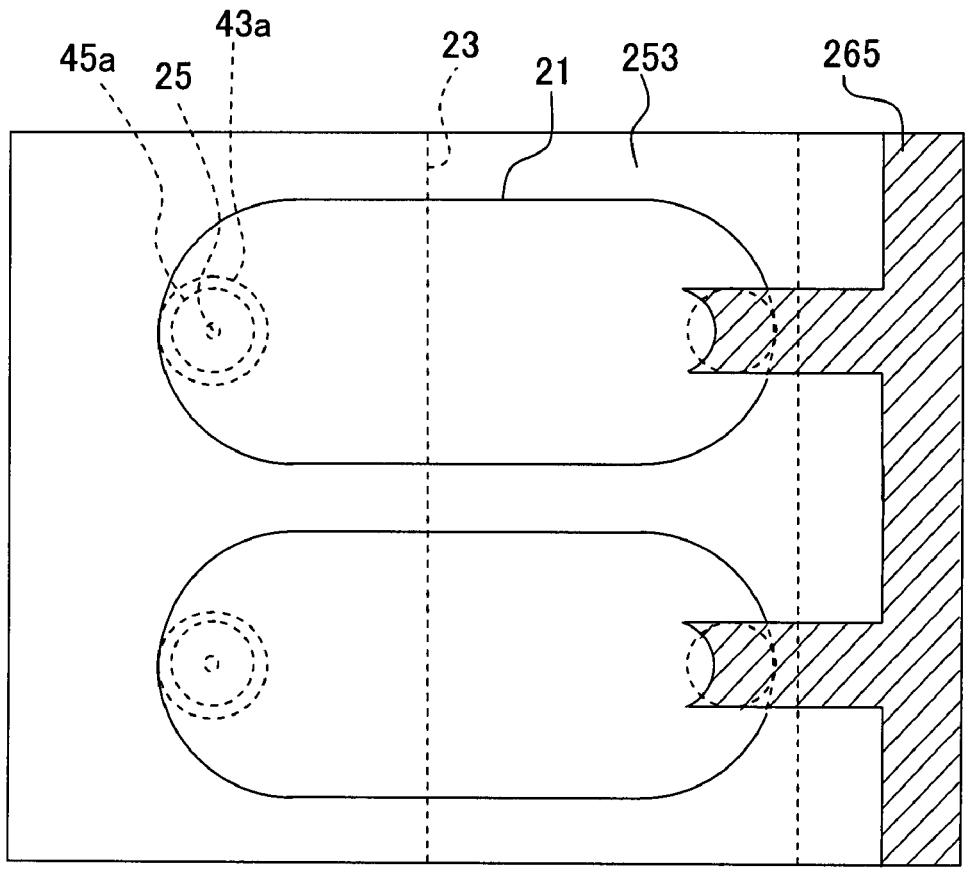
FIG. 14A and FIG. 14B are diagrams showing a step of removing a polarizing electrode in the manufacturing process of the piezoelectric actuator of the second embodiment.
Figure 14B:
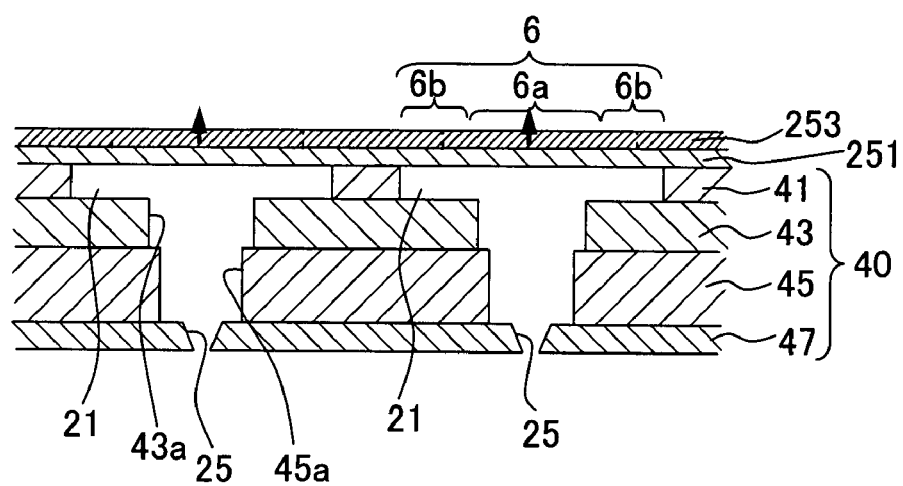

Next, as shown in FIGS. 13A and 13B, an electric potential of the first polarizing electrode 261 is set to be −60 V, and an electric field is applied to a portion of the piezoelectric material layer 253, sandwiched between the first polarizing electrode 261 and the vibration plate 251 which is kept at the ground electric potential, and this portion is polarized upward (step S13: first polarization step). Thereafter, as shown in FIG. 14, only the first polarizing electrode 261 is removed such that the connecting wire 265 is not removed (step S14: polarizing electrode removing step). In other words, at this time, as shown in FIG. 14A, the connecting wire 265 is connected to an edge portion of an end portion (right end portion in the diagram) in a longitudinal direction of an area on the surface of the piezoelectric material layer 253, corresponding to the substantially elliptical active area 6.

Figure 15A:
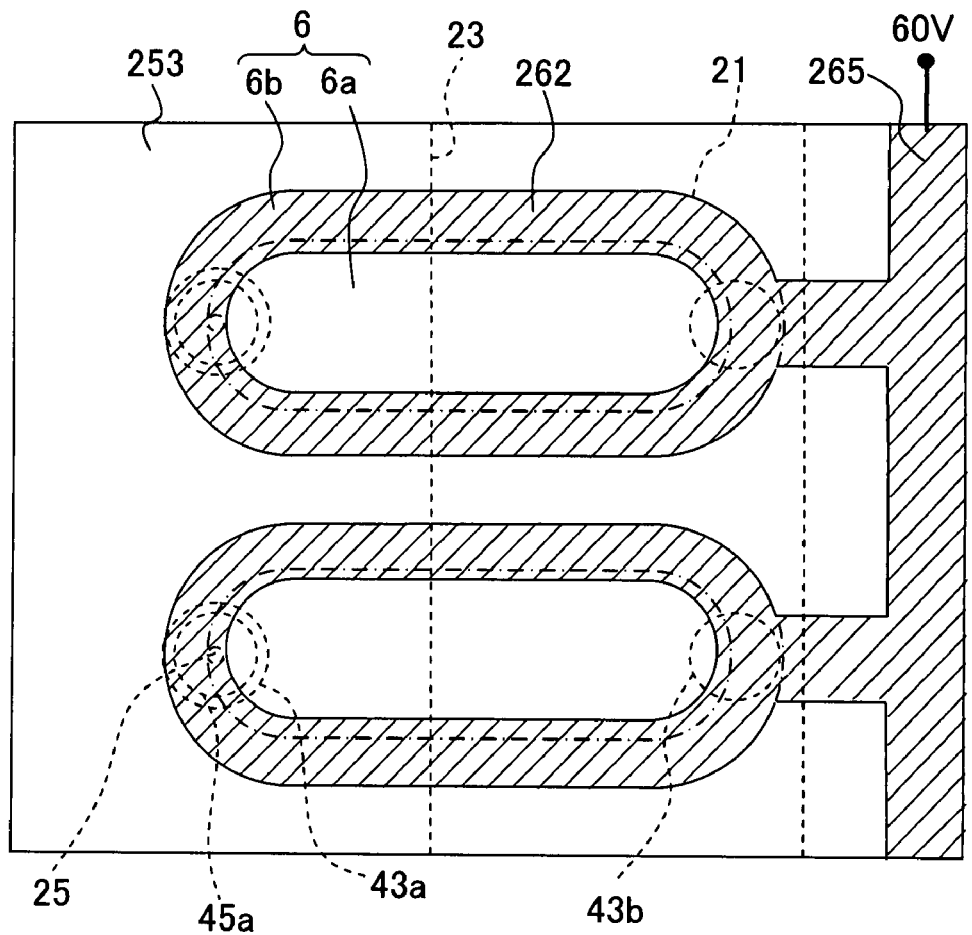
FIG. 15A and FIG. 15B are diagrams showing a step of second polarization in the manufacturing process of the piezoelectric actuator of the second embodiment.

Furthermore, a second polarizing electrode 262 is formed in an area on the surface of the piezoelectric material layer 253, corresponding to the edge portion 6b of the active portion 6 (step S15: second polarizing electrode forming step). As shown in FIG. 15, the second polarizing electrode 262 is formed, in the second polarizing electrode forming step, in a substantially O-shaped area along an edge of the active portion 6. In other words, the second polarizing electrode 262 is formed along an entire circumference of the edge of the active portion 6. At this time, as it has been mentioned above, the second polarizing electrodes 262 formed in the area of the piezoelectric material layer 253, corresponding to the plurality of active portions 6 are mutually connected by the connecting wire 265 which is left in the process at step S14. Moreover, the area surrounded by the second polarizing electrode 262 formed to be substantially O-shaped, in other words, an area in which the electrode is formed in the area on the surface of the piezoelectric material layer 253, corresponding to the active portion 6 in a state of step S15 is slightly smaller than the area in which the polarizing electrode 261 is formed in step S12 (an area surrounding the alternate long and short dash line in FIG. 15A). In other words, an area, of the piezoelectric material layer 253, in which the first polarizing electrode 261 is formed and another area, of the piezoelectric material layer 253, in which the second polarizing electrode 262 is formed, overlap partially.

Figure 15B:
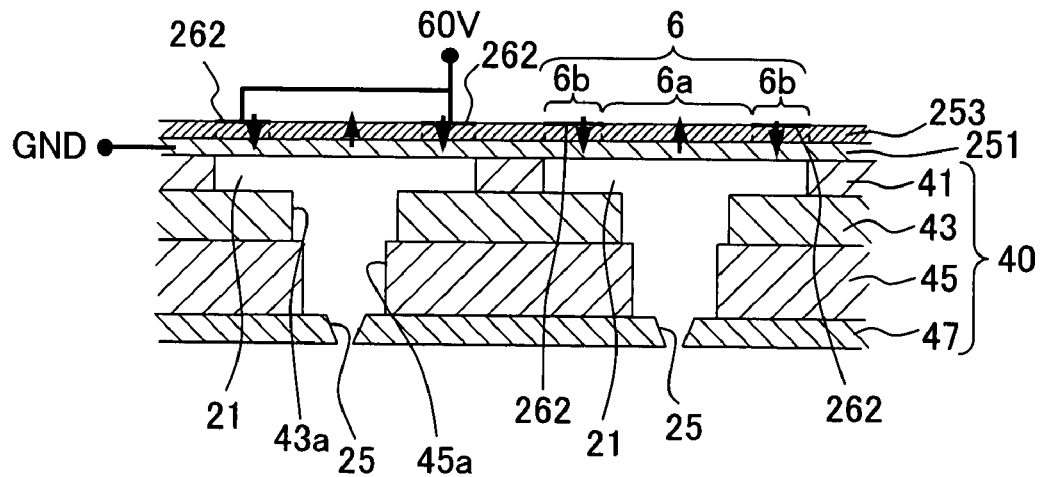
Figure 16A:
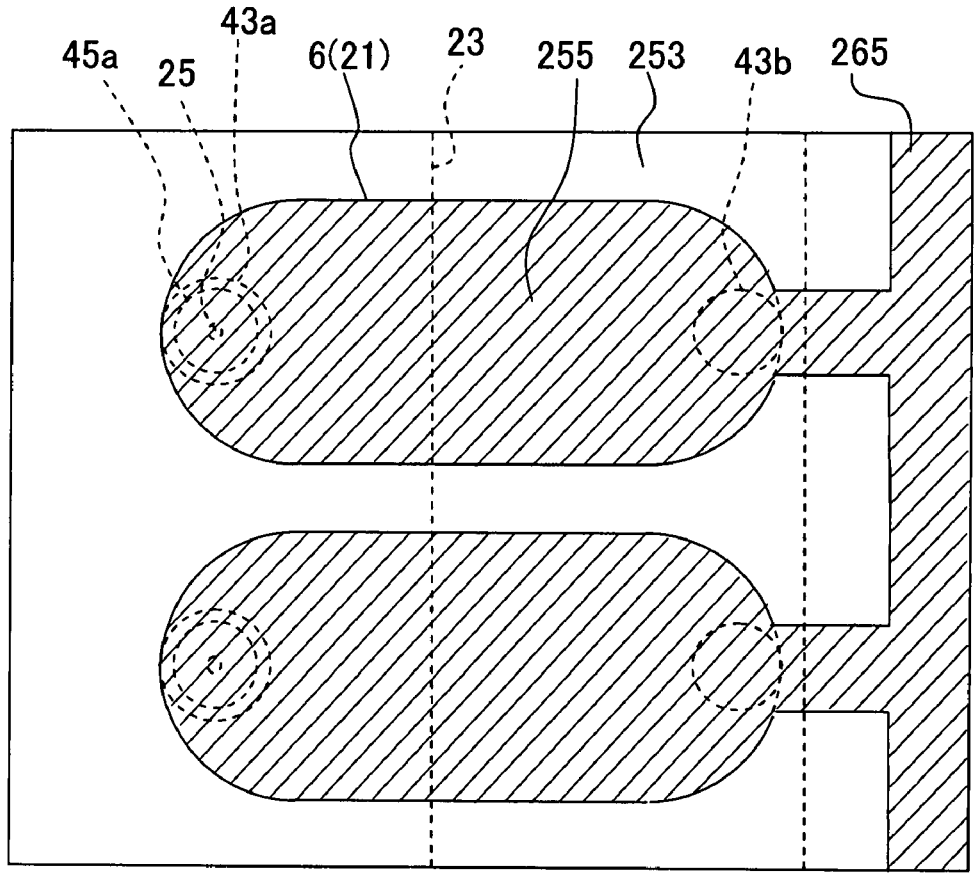
FIG. 16A and FIG. 16B are diagrams showing a step of forming a second electrode in the manufacturing process of the piezoelectric actuator of the second embodiment.
Figure 16B:
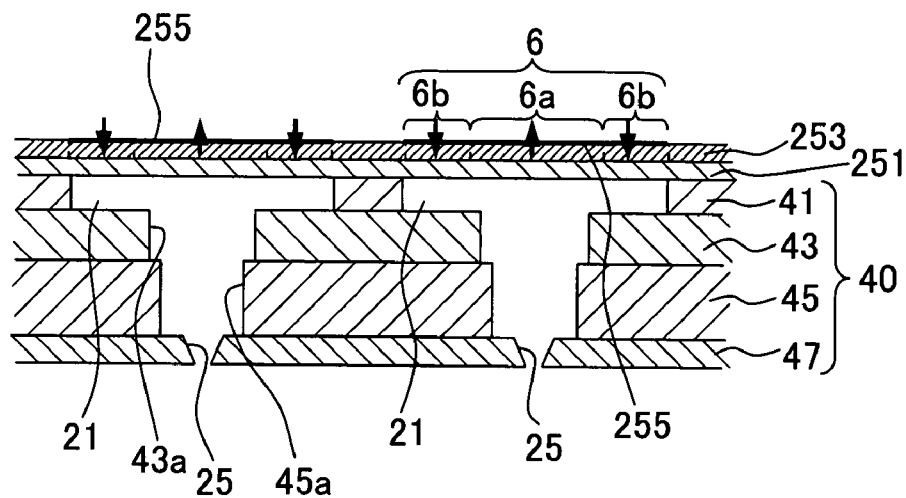

Next, as shown in FIGS. 15A and 15B, an electric potential of the second polarizing electrode 262 is set to be 60 V, and an electric field is applied to a portion of the piezoelectric material layer 253 sandwiched between the second polarizing electrode 262 and the vibration plate 251 which is kept at the ground electric potential (step S16: second polarization step). Thereafter, as shown in FIGS. 16A and 16B, an individual electrode 255 is formed in an entire area on the surface of the piezoelectric layer 253, corresponding to each active portion 6 (step S17: second electrode forming step). At this time, since the second polarizing electrode 262 is formed in a certain portion of the corresponding area of the piezoelectric material layer 253, an electrode is formed in a residual portion excluding the certain portion of the corresponding area, the residual portion being an area in which the second polarizing electrode 262 is not formed. Consequently, an electrode on the entire corresponding area corresponding to the active portion 6 is formed. The electrode may be formed to overlap with the second polarizing electrode 262.

Finally, the connecting wire 265 is divided, and the connections between the individual electrodes 255 corresponding to the plurality of active portions 6 are cut off (step S18). In the second embodiment, as shown in FIGS. 17A and 17B, the connecting wire 265 is removed leaving a part of the individual electrode 255 formed in the area corresponding to the operating section 6, and a portion which becomes a terminal portion 254 formed at the one end (right end in FIG. 17A) in the longitudinal direction of the individual electrode 255. Accordingly, as shown in FIGS. 17A and 17B, the individual electrodes 255 which are electrically isolated are formed in the area on the surface of the piezoelectric layer 253, corresponding to the active portion 6.

The abovementioned procedure is one example, and can be changed appropriately. For example, the first polarizing electrode forming step and the connecting wire forming step in step S12 may be carried out separately.

In this manner, in the second embodiment, similarly as in the first embodiment, even when the drive voltage is low, it is possible to impart a sufficient amount of deformation to the piezoelectric actuator 250, for jetting the ink from the nozzles 25.

Moreover, in the second embodiment, the first polarization step is carried out at step S13 by using the first polarizing electrode 261 formed in step S12, and then, the first polarizing electrode 261 is removed and the second polarization step is carried out in step S16 by using the second polarizing electrode 262 formed in the step S15. Consequently, at the time of carrying out the first polarization step, the second polarizing electrode 262 does not exist on the surface of the piezoelectric material layer 253, and at the time of carrying out the second polarization step, the first polarizing electrode 261 does not exist on the surface of the piezoelectric material layer 253. Therefore, at the time of polarizing the central portion 6a and the edge portion 6b of the active portion 6 in opposite directions, it is possible to form the central portion 6a and the edge portion 6b without being isolated. Accordingly, as compared to a case in which the two areas of the active portion 6a having mutually different directions of polarization are formed to be isolated, since the entire area in the active portion 6 contributes to the deformation of the piezoelectric actuator 250, it is possible to improve a driving efficiency.

Furthermore, in the second embodiment, an area on the surface of the piezoelectric material layer 253 in which the first polarizing electrode 261 is formed and another area on the surface of the piezoelectric material layer 253 in which the second polarizing electrode 262 is formed, overlap partially. Consequently, it is possible to form the central portion 6a and the edge portion 6b without being isolated assuredly.

Moreover, in the second embodiment, the second polarizing electrode is formed along the entire circumference of an edge in the active portion 6, and the second polarization step is carried out after the first polarization step. Consequently, it is possible to polarize an area, corresponding to a ring-shaped edge portion 6b in the active portion 6, in a direction opposite to the direction in which the central portion 6a is polarized. In other words, since it is possible to deform spontaneously an entire circumference portion corresponding to the edge portion 6b in the piezoelectric actuator 250, it is possible to improve further the driving efficiency.

Moreover, in the second embodiment, after forming the first polarizing electrode 261 and the connecting wire 265 which connects the first polarizing electrodes 261 in step S12, only the first polarizing electrode 261 is removed, in step S14, such that the connecting wire 265 is not removed, and the second polarizing electrodes 262 are formed to be connected by the connecting wire 265 in step S15. Consequently, it is possible to connect easily as compared to a case in which the first polarizing electrodes 261 are connected by a connecting cable and the second polarizing electrodes 262 are connected by a connecting cable for example. Furthermore, since the connecting wire 265 which is formed in the connecting wire forming step carried out, connects the first polarizing electrodes 261 at the time of the first polarization step, and also connects the second polarizing electrodes 262 at the time of the second polarization step, it is possible to reduce the number of steps as compared to a case in which the connecting wire which connects the first polarizing electrodes 261 and the connecting wire which connects the second polarizing electrodes 262 are formed in separate steps.

Third Embodiment

Figure 18:
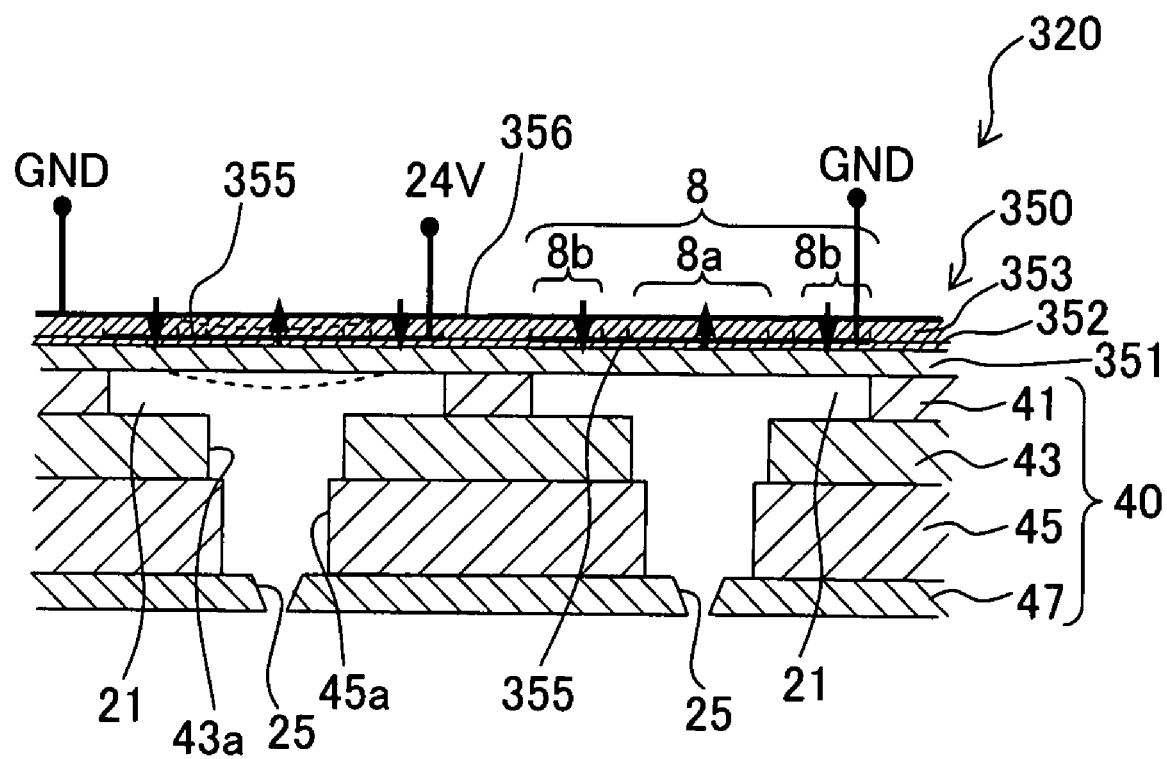
FIG. 18 is a cross-sectional view of an ink-jet head according to a third embodiment of the present invention.
Figure 19:
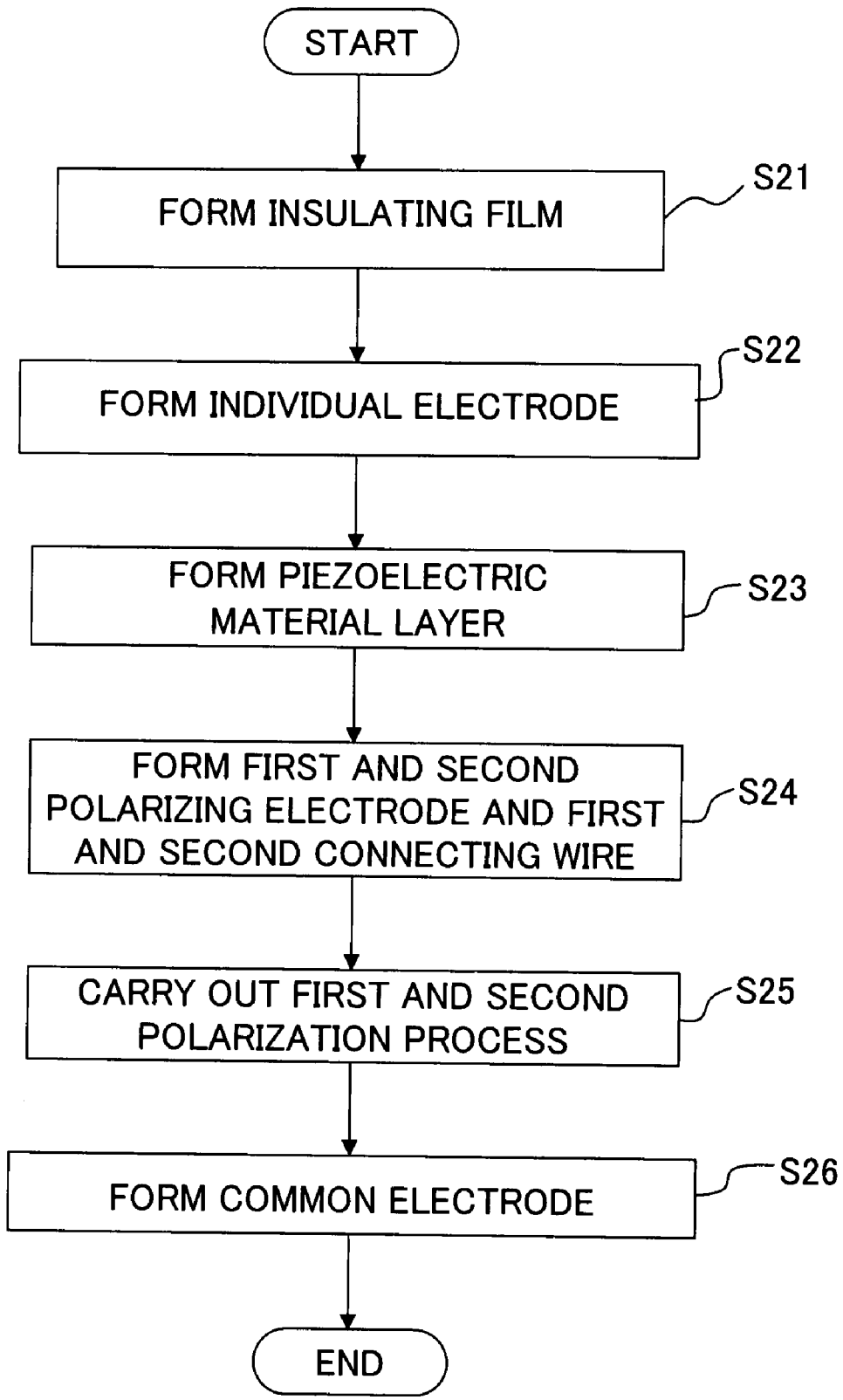
FIG. 19 is a flowchart showing a manufacturing process of a piezoelectric actuator shown in FIG. 18.

Next, a third embodiment of the present invention will be described below with reference to FIGS. 18 and 19. FIG. 18 is a cross-sectional view of an ink-jet head of the third embodiment, and corresponds to FIG. 5 of the first embodiment. FIG. 19 is a flowchart showing a manufacturing process of a piezoelectric actuator of the third embodiment. The third embodiment is similar to the first embodiment except for a structure of a piezoelectric actuator 350. The point of difference between the structure of the piezoelectric actuator 350 according to the third embodiment and the structure of the piezoelectric actuator 50 according to the first embodiment is described below. In the piezoelectric actuator 50, the vibration plate 51 functions as a common electrode, but in the piezoelectric actuator 350 of the third embodiment, a common electrode 356 is provided separately from a vibration plate 351. In the following description, same reference numerals are assigned to components which have a structure similar to that in the first embodiment, and the description of such components is omitted appropriately.

As shown in FIG. 18, the piezoelectric actuator 350 includes the vibration plate 351, an insulating film 352, a plurality of individual electrodes 355, a piezoelectric material layer 353, and the common electrode 356. The vibration plate 351 is arranged on the upper surface of the channel unit 40. The insulating film 352 is formed on the surface of the vibration plate 351. The individual electrodes 355 are formed on a surface of the insulating film 353, corresponding to the pressure chambers 21 respectively. The piezoelectric material layer 353 is formed on the surface of the insulating layer 352 on which the individual electrodes 355 are formed. The common electrode 356 is formed on a surface of the piezoelectric material layer 353.

The vibration plate 351, similarly as in the first embodiment, is joined by stacking on the upper surface of the cavity plate 41, closing the openings of the pressure chambers 21. In the third embodiment, the vibration plate 351 is let to be made of stainless steel. However, the vibration plate 351 may also be made of a non-electroconductive material such as a ceramics material, a glass material, a synthetic resin, and silicon on which a surface oxidation treatment is applied.

The insulating film 352 made of a ceramics material such as alumina and zirconia is formed on the surface of the vibration plate 351 by the AD method. The individual electrodes 355 made of an electroconductive material, having a shape same as the shape of the pressure chamber 21 similarly as in the first embodiment are formed on the surface of the insulating film 352, at positions overlapping with the corresponding pressure chambers 21 in a plan view. A wire which is not shown in the diagram, which connects each individual electrode 355 to a driving circuit such as a driver IC via a wiring member such as a flexible printed circuit board, is formed on the surface of the insulating film 352. Accordingly, the driving electric potential is selectively applied to the individual electrodes 355.

The piezoelectric material layer 353 having PZT as the main constituent is formed by the AD method similarly as in the first embodiment, on the surface of the insulating film 352 on which the individual electrodes 355 are formed. The piezoelectric material layer 353 is formed continuously, spreading over the pressure chambers 21. The common electrode 356 made of an electroconductive material is formed on the surface of the piezoelectric material layer 353, commonly for the individual electrodes 355. The common electrode 356 is kept at the ground electric potential all the time.

The piezoelectric material layer 353, similarly as in the first embodiment, is polarized in a thickness direction thereof, that is, a central portion 8a of an active portion 8 which is sandwiched between the individual electrode 355 and the common electrode 356, is polarized in upward in the thickness direction of the piezoelectric material layer 353 (direction from a side of the individual electrode 355 toward the common electrode 356), and an edge portion 8b of the active portion 8, is polarized in downward in the thickness direction (direction from a side of the common electrode 356 toward the individual electrode 356).

Here, an action of the piezoelectric actuator 350 will be described below. As shown in FIG. 18, when a positive driving electric potential (24 V in the third embodiment) is selectively applied to the individual electrodes 355, an electric field in the upward direction (direction from the side of the individual electrode 355 toward the common electrode 356) is generated in the active portion 8 in the piezoelectric material layer 353. At this time, the central portion 8a in the active portion 8 corresponding to the individual electrode 355 to which the driving electric potential is applied is polarized upward as described above. Since the direction of the electric field and the direction of polarization are same, the central portion 8a is contracted in a horizontal direction orthogonal to the thickness direction which is the direction of polarization, due to the piezoelectric transverse effect. Whereas, the edge portion 8b in the active portion 8 is polarized downward as described above, and since the direction of the electric field and the direction of polarization are opposite, the edge portion 8b is extended in the horizontal direction.

Moreover, when the central portion 8a of the active portion 8 is contracted in the horizontal direction, a portion of the vibration plate 351, corresponding to the central portion 8a of the active portion 8 is bent to form a projection toward the pressure chamber 21. On the other hand, an end of another portion of the vibration plate 351 joined to the channel unit 40 cannot be deformed, the another portion corresponding to the edge portion 8b of the active portion 8. Therefore, when the edge portion 8b of the active portion 8 is contracted in the horizontal direction, the other end, of the another portion of the vibration plate 351, opposite to the end joined to the channel 40, is bent to be deformed toward the pressure chamber 21. As shown by dashed lines in FIG. 18, a portion of the piezoelectric actuator 350 corresponding to the active portion 8, that is, a portion of the piezoelectric actuator 350 corresponding to the pressure chamber 21 is bent to form a projection toward the pressure chamber 21. Accordingly, the volume of the pressure chamber 21 is decreased, and the jetting pressure is applied to the ink in the pressure chamber 21, and the droplets of ink are jetted from the nozzle 25 communicating with the pressure chamber 21. In this manner, a pushing ejection is carried out in an ink-jet head 320 which includes the piezoelectric actuator 350 of the third embodiment.

Next, an example of a manufacturing process of a piezoelectric actuator of the third embodiment will be described below with reference to FIG. 19.

Firstly, the insulating film 352 is formed on the surface of the vibration plate 351 (step S21). Next, a plurality of individual electrodes 355 is formed in a whole of corresponding area, on the surface of the insulating film 352 formed in step S21, facing the pressure chamber 21 (step S22: first electrode forming step). At this time, wires for connecting each individual electrode 355 to a wiring member such as a flexible printed circuit board are formed simultaneously. Furthermore, the piezoelectric material layer 353 is formed by the AD method on the surface of the insulating film 352 on which the individual electrodes 355 are formed in step S22 (step S23)

Next, similarly as in the first embodiment, the first polarizing electrode 61 is formed on the surface of the piezoelectric material layer 353 formed in step S23, in an area corresponding to the central portion 8a of each active portion 8; and the second polarizing electrode 62 is formed on the surface of the piezoelectric material layer 352, in an area corresponding to the edge portion 8b of each active portion 8. A connecting wire 65 which connects the first polarizing electrodes 61 is formed, and a connecting wire 66 which connects the second polarizing electrodes 62 is formed (step S24: first and second polarizing electrode forming step and first and second connecting wire forming step).

Next, with the electric potential of all individual electrodes 355 let to be the ground electric potential, the electric potential of the first polarizing electrode 61 is let to be −60 V, the electric potential of the second polarizing electrode 62 is let to be 60 V, and an electric field is applied to a portion of the piezoelectric material layer 353, which is sandwiched between the individual electrode 355 and the first polarizing electrode 61, and a portion of the piezoelectric material layer 353 which is sandwiched between the individual electrode 355 and the second polarizing electrode 62 (step S25: first and second polarization step). Finally, the common electrode 356 is formed on the surface of the piezoelectric material layer 353, along the individual electrodes 355 (step S26: second electrode forming step).

The abovementioned procedure is one example, and can be changed appropriately. For example, the four steps namely the first and the second polarizing electrode forming step, and the first and the second connecting wire forming step in step S24 may be carried out separately, and also the first and second polarization steps in step S25 may be carried out separately.

As it has been described above, in the third embodiment, similarly as in the first embodiment, even when the drive voltage is low, it is possible to impart sufficient amount of deformation to the piezoelectric actuator 350, for jetting the ink from the nozzles 25.

Figure 20:
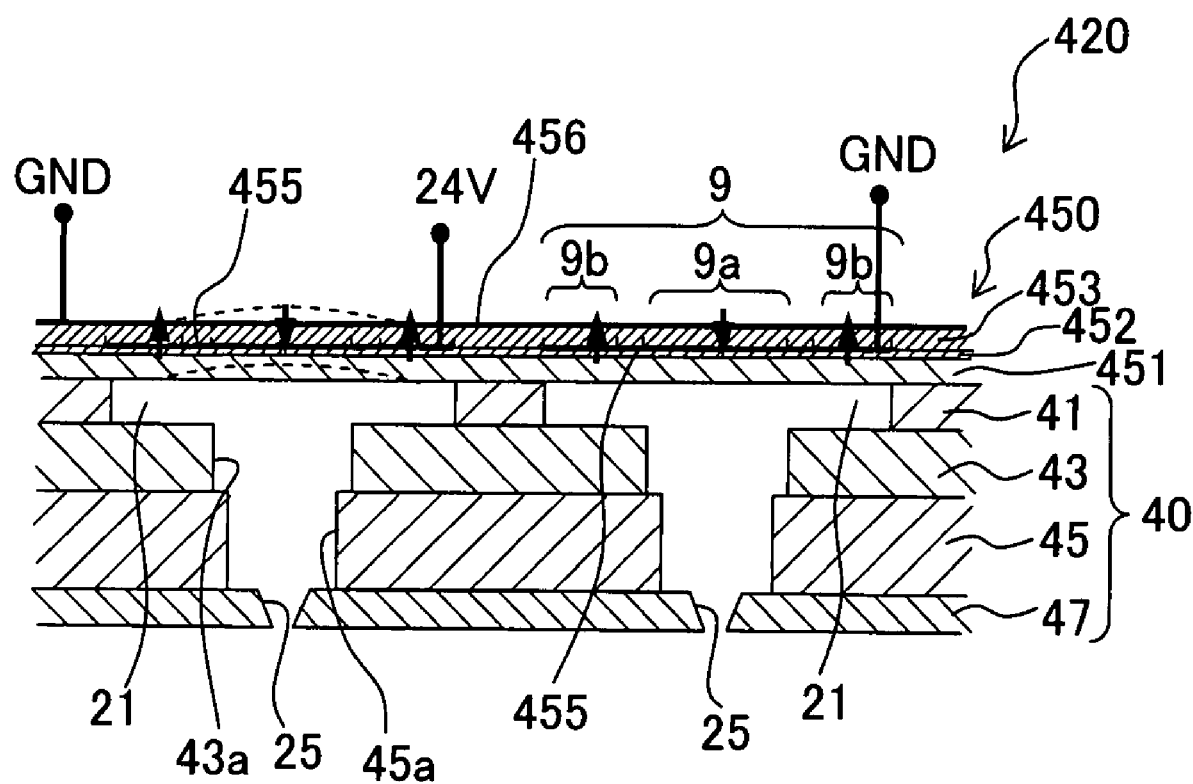
FIG. 20 is a cross-sectional view of an ink-jet head according to a modified embodiment of the third embodiment.

Here, a modified embodiment of the third embodiment will be described with reference to FIG. 20. FIG. 20 is a cross-sectional view of an ink-jet head according to the modified embodiment of the third embodiment, and corresponds to FIG. 18 of the third modified embodiment. In this modified embodiment, the direction of polarization of the active portion 8 of the piezoelectric material layer 353 in the third embodiment is changed.

As shown in FIG. 20, a central portion 9a in an active portion 9 of a piezoelectric material layer 453 is polarized downward, and an edge portion 9b in the active portion 9 is polarized upward. Consequently, with a common electrode 456 kept at the ground electric potential, when the positive driving electric potential is selectively applied to individual electrodes 455, an electric field in an upward direction is generated in the active portion 9 of the piezoelectric material layer 453. At this time, since the central portion 9a in the active portion 9, corresponding to the individual electrode 455 to which the driving electric potential is applied, is polarized in a direction opposite to the direction of the electric field, the central portion 9a is extended in the horizontal direction which is orthogonal to the direction of polarization. Whereas, since the edge portion 9b in the active portion 9 is polarized in the direction same as the direction of the electric field, the edge portion 9b is contracted in the horizontal direction.

When the central portion 9a of the active portion 9 is extended in the horizontal direction, a portion, of a vibration plate 451, corresponding to the central portion 9a of the active portion 9 is bent to form a projection toward the pressure chamber 21. Whereas, an end of another portion of the vibration plate 451, joined to the channel unit 40 cannot be deformed, the another portion corresponding to the edge portion 9b of the active portion 9. Therefore, when the edge portion 9b of the active portion 9 is contracted in the horizontal direction, the other end, opposite to the end joined to the channel unit 40, of the another portion is bent to be displaced toward a side opposite to the pressure chamber 21. In other words, as shown by dashed lines in FIG. 20, a portion of the piezoelectric actuator 450, corresponding to the active portion 9, that is, a portion corresponding to the pressure chamber 21 is bend to form a projection toward a side opposite to the pressure chamber 21. Accordingly, when the volume of the pressure chamber 21 increased, and then the volume of the pressure chamber 21 is returned to the original volume at a timing when the pressure in the pressure chamber 21 changes from the negative pressure to the positive pressure, the droplets of ink are jetted from the nozzle 25 communicating with the pressure chamber 21. In this manner, a pushing ejection is carried out in an ink-jet head 420 which includes the piezoelectric actuator 450 of the modified embodiment of the third embodiment.

According to the modified embodiment of the third embodiment, similarly as in the third embodiment, even when the drive voltage is low, it is possible to impart sufficient amount of deformation to the piezoelectric actuator 450, for jetting the ink from the nozzles 25.

Fourth Embodiment

Next, a fourth embodiment of the present invention will be described below with reference to FIGS. 21A to 24B. FIGS. 21A to 24B, show an ink-jet head in a manufacturing process of a piezoelectric actuator of the fourth embodiment. FIGS. 21A, 22A, 23A, and 24A are partial top views (when viewed from the side opposite to the side facing the recording paper), and FIGS. 21B, 22B, 23B, and 24B are cross-sectional views.

The fourth embodiment is similar to the first embodiment except for a structure of a piezoelectric actuator 550. The main point of difference between the structure of the piezoelectric actuator 550 according to the fourth embodiment and the structure of the piezoelectric actuator 50 according to the first embodiment is described below. In the piezoelectric actuator 50, the individual electrode 55 and the pressure chamber 21 are facing mutually along the entire surface, whereas in the piezoelectric actuator 550 of the fourth embodiment, an individual electrode 555 and the pressure chamber 21 are facing partially (refer to FIG. 24). In the following description, same reference numerals are assigned to components which have a structure similar to that in the first embodiment, and the description of such components is omitted appropriately.

Firstly, the manufacturing process of the piezoelectric actuator 550 of the fourth embodiment will be described below. At first, similarly as in step S1 (first electrode forming step) of the first embodiment, a piezoelectric material layer 553 is formed on a surface of a vibration plate 551 which functions as the common electrode. Next, as shown in FIG. 21, a first polarizing electrode 561 is formed in an area on a surface of the piezoelectric material layer 553, corresponding to a central portion 3a of each active portion 3; and a second polarizing electrode 562 is formed in another area on a surface of the piezoelectric material layer 553, corresponding to an edge portion 3b of each active portion 3. Furthermore, a first connecting wire 565 which connects the first polarizing electrodes 561 is formed and a second connecting wire 566 which connects the second polarizing electrodes 562 is formed (first and second polarizing electrode forming step, and first and second connecting wire forming step).

Figure 21A:
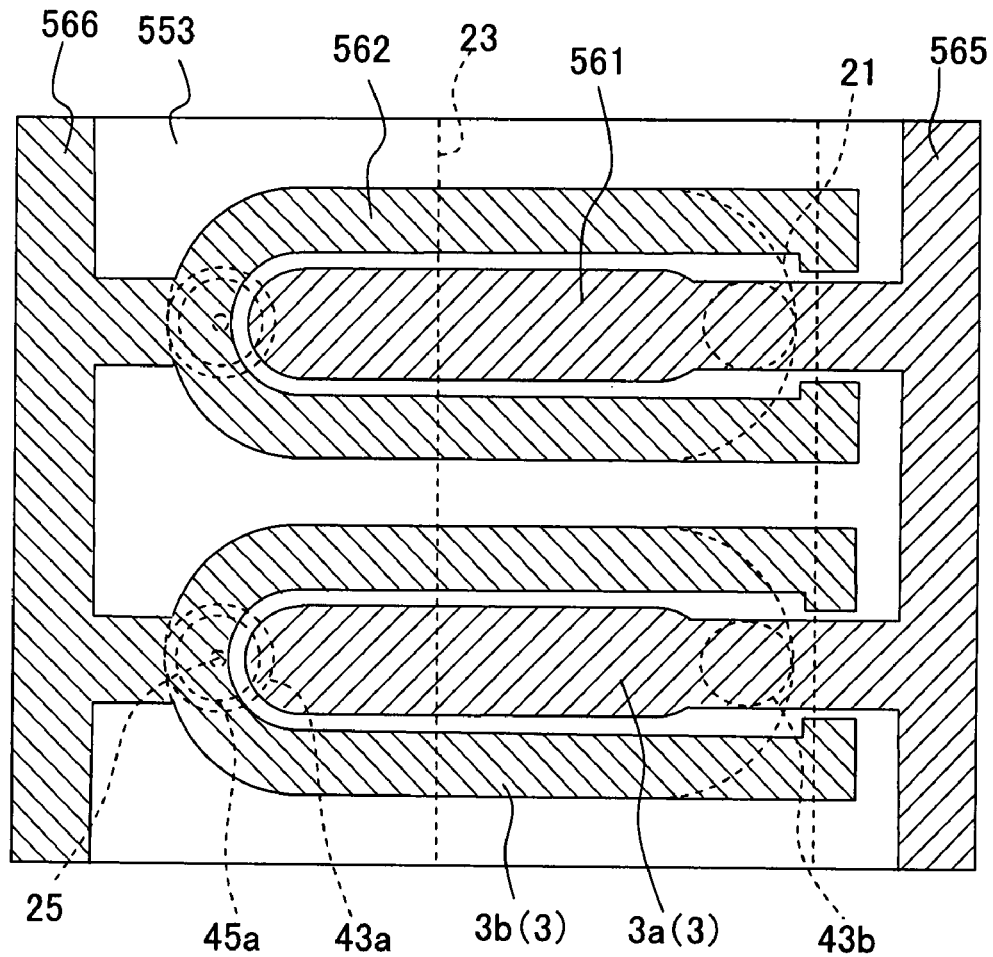
FIG. 21A and FIG. 21B are diagrams showing a step of forming first and second polarizing electrodes in a manufacturing process of a piezoelectric actuator according to a fourth embodiment.
Figure 21B:
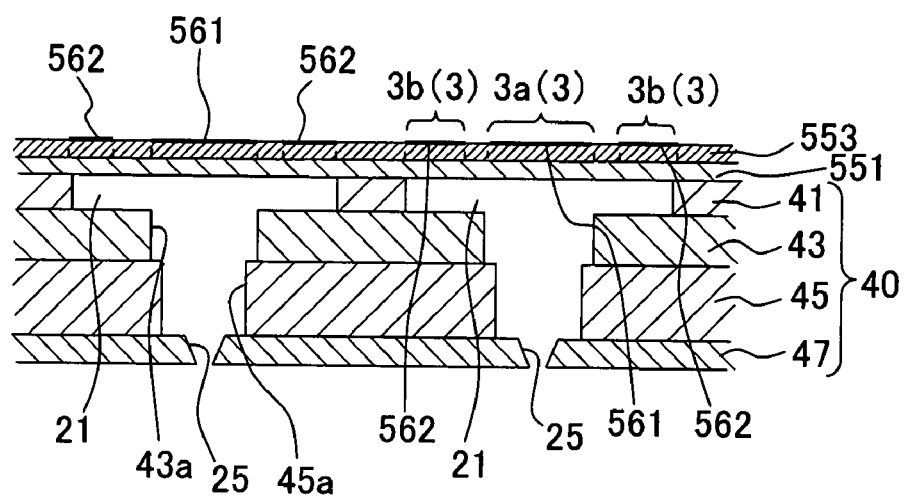

At this time, as shown in FIG. 21A, the central portion 3a of the active portion 3 in which the first polarizing electrode 561 is formed, coincides with a central portion of an area of the piezoelectric material layer 553, facing the pressure chamber 21 similarly as in the first embodiment. In the edge portion 3b of the active portion 3, a second polarizing electrode 562 having a substantially U-shaped edge portion, and which is bent to be hook-shaped in directions mutually close at one end portion thereof, is formed. The second polarizing electrode 562 is formed in an area of the piezoelectric material layer 553, facing the elliptical shaped pressure chamber 21, and an extended area which is extended from one end portion (right end portion in FIG. 21A) of the area, up to an area not facing the pressure chamber 21. A gap is formed between one end portion of the edge portion 3b, and the first connecting wire 565 which is connected to the end portion (right-side end portion in FIG. 21A) in a longitudinal direction of the first polarizing electrode 561.

Figure 22A:
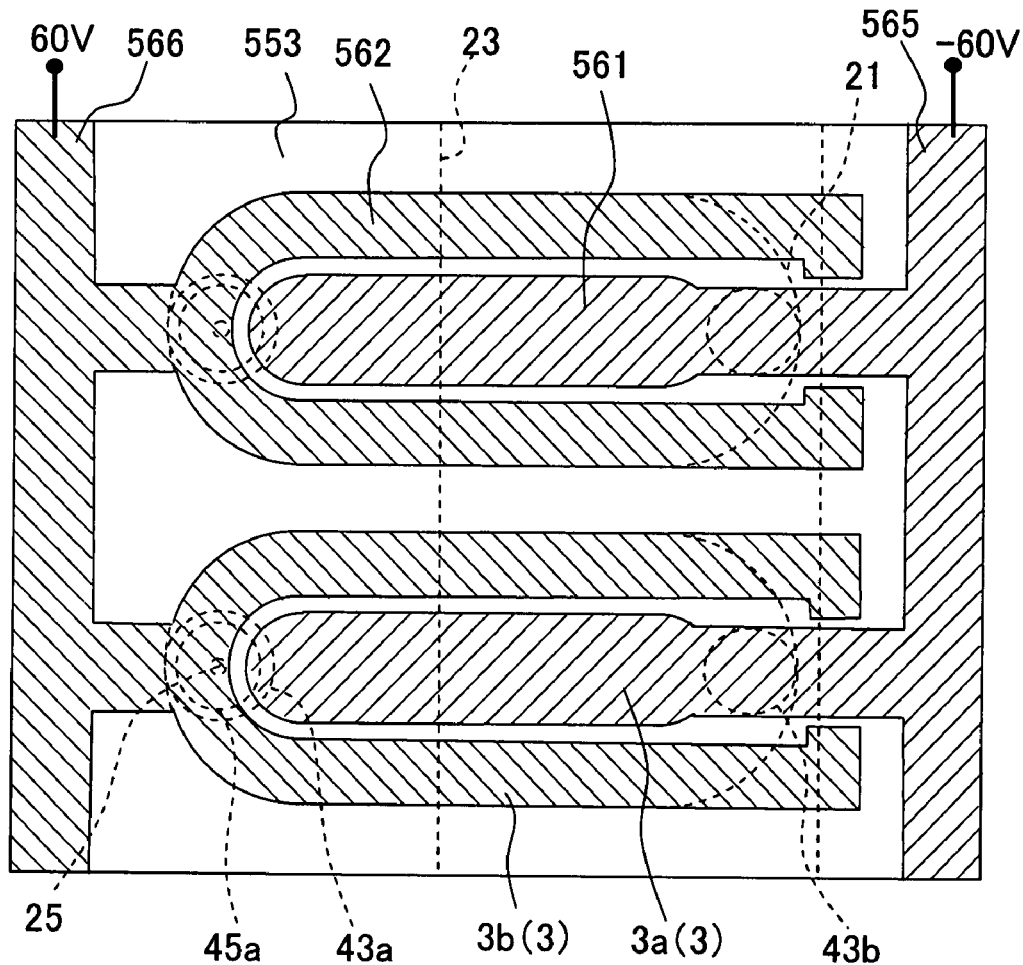
FIG. 22A and FIG. 22B are diagrams showing a step of first and second polarization in the manufacturing process of the piezoelectric actuator according to the fourth embodiment.
Figure 22B:
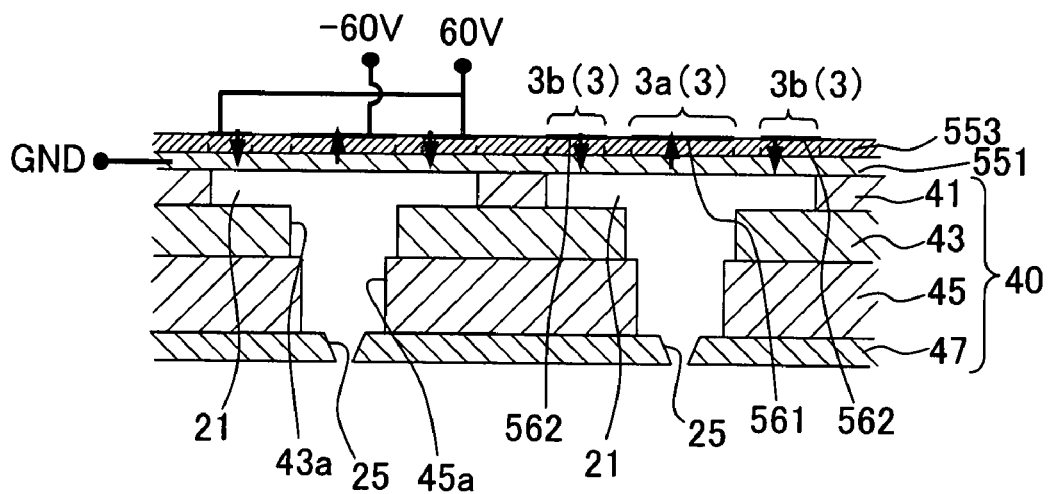

Next, as shown in FIGS. 22A and 22B, the electric potential of the first polarizing electrode 561 is set to be −60 V, the electric potential of the second polarizing electrode 562 is set to be 60 V, and an electric field is applied to a portion of the piezoelectric material layer 563 which is sandwiched between the vibration plate 551 and the first polarizing electrode 561; and the electric field is also applied to a portion of the piezoelectric material layer 563 which is sandwiched between the vibration plate 551 and the second polarizing electrode 562 (first and second polarization step). Accordingly, the central portion 3a in the active portion 3 is polarized upward, and the edge portion 3b in the active portion 3 is polarized downward as shown in FIG. 22B.

Figure 23A:
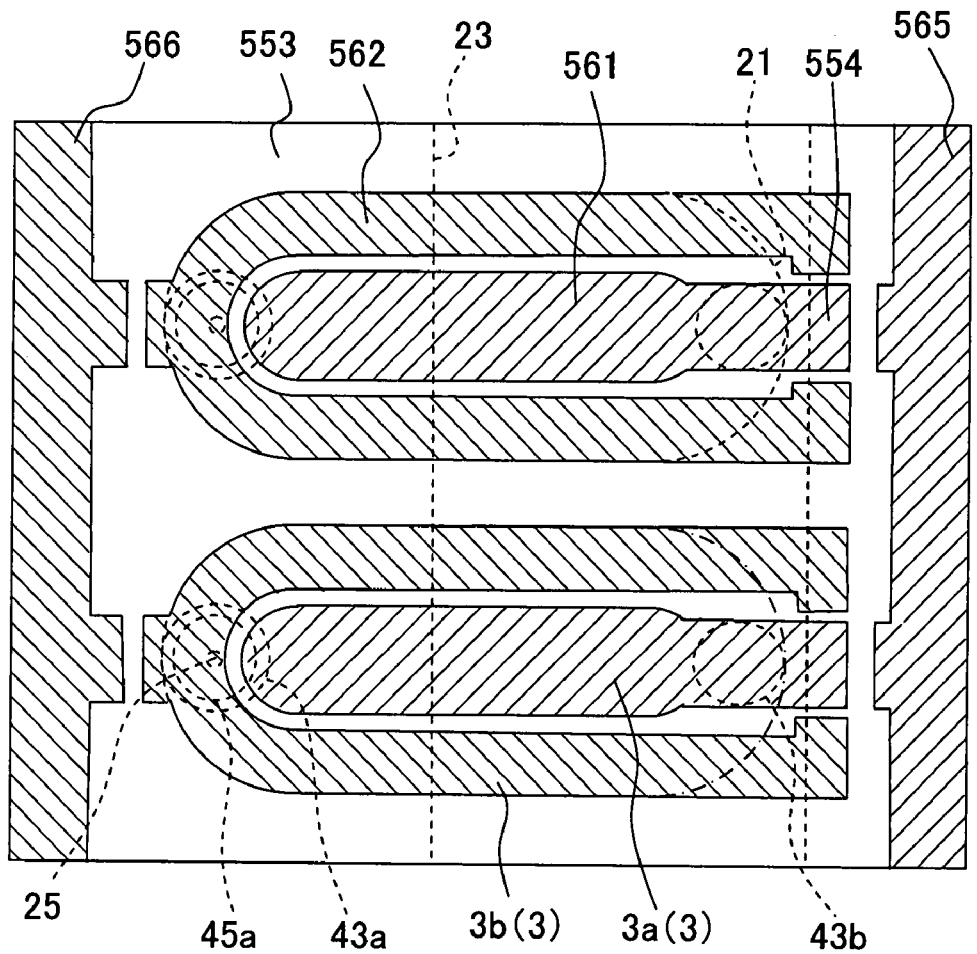
FIG. 23A and FIG. 23B are diagrams showing a step of dividing first and second connecting wires in the manufacturing process of the piezoelectric actuator according to the fourth embodiment.
Figure 23B:
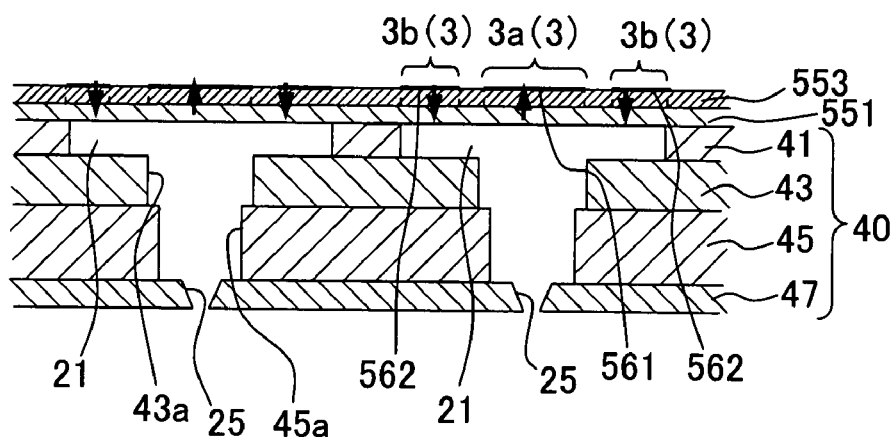

Further, as shown in FIG. 23A, the first connecting wire 565 is divided, and the connections between the first polarizing electrodes 561 by the first connecting wire 565 are disconnected, and the second connecting wire 566 is divided, and the connections between the second polarizing electrodes 562 by the second connecting wire 566 (first and second connecting wire dividing step) are disconnected. At this time, as shown in FIG. 23A, the first connecting wire 565 is divided from the first polarizing electrode 561 at an opposite side (right side in the diagram) of a side of the first polarizing electrode 561, of a portion sandwiched by the pair of end portions bent to be hook-shaped, of the substantially U-shaped second polarizing electrode 562. A portion on the side of the first polarizing electrode 561, farther from a dividing portion of the first connecting wire 565 is a terminal portion 554.

Figure 24A:
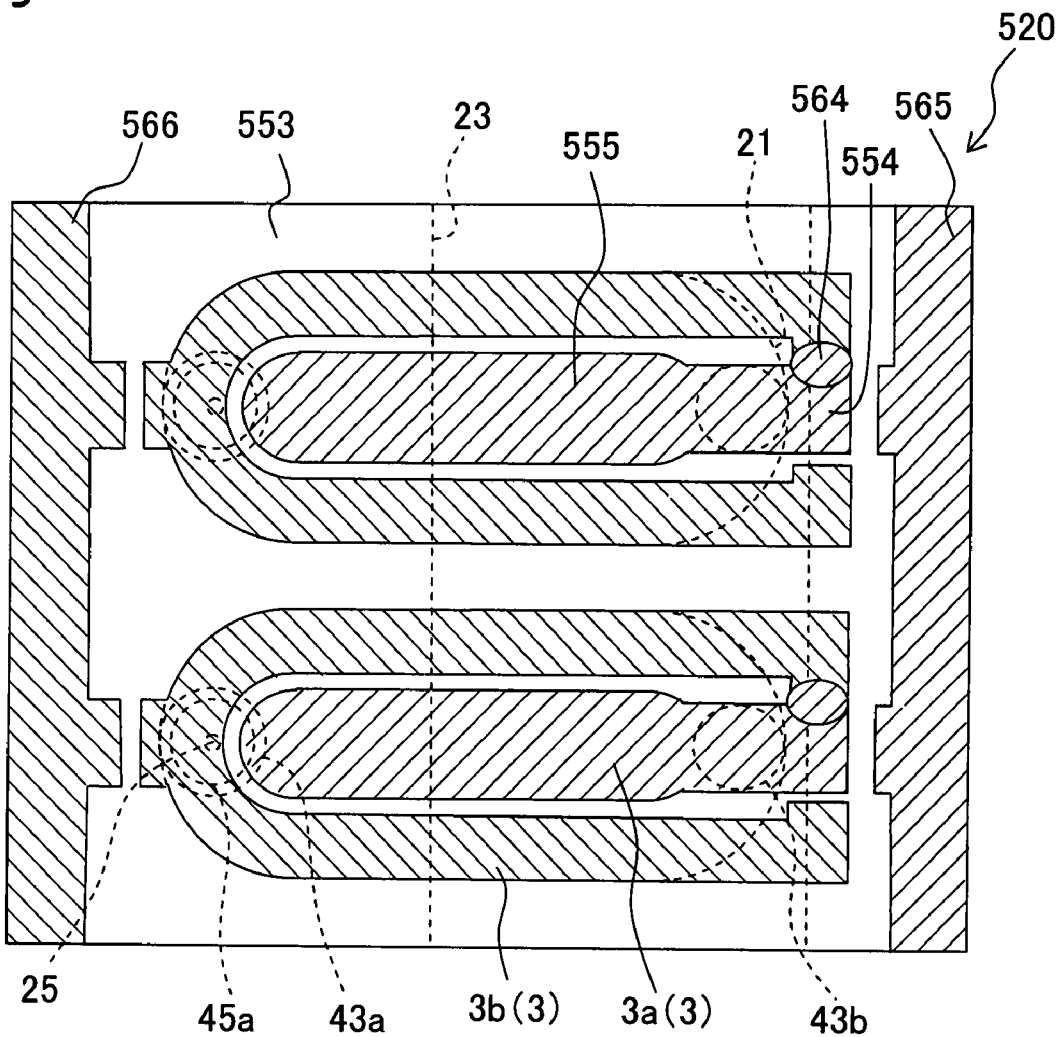
FIG. 24A and FIG. 24B are diagrams showing a step of forming a second electrode in the manufacturing process of the piezoelectric actuator according to the fourth embodiment.
Figure 24B:
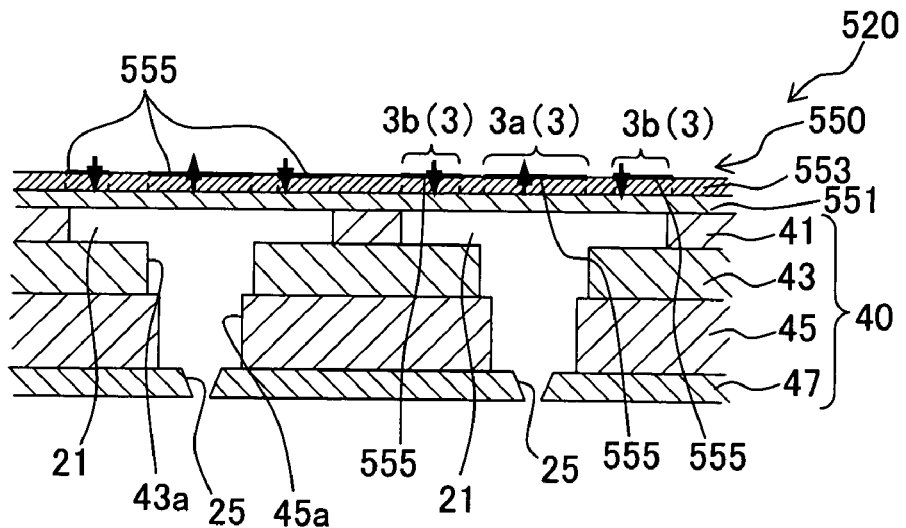

Thereafter, as shown in FIG. 24A, a connecting electrode 564 which connects the terminal portion 554 and the second polarizing electrode 562, is formed between the terminal portion 554 and the end portion bent to be hook-shaped, in the substantially U-shaped second polarizing electrode 562 (refer to FIG. 23A). Accordingly, the first polarizing electrode 561 and the second polarizing electrode 562 are electrically connected, via the connecting electrode 564 and the terminal portion 554, to be an individual electrode 555 (second electrode forming step). It is possible to use appropriate methods such as the screen printing, the sputtering method, or the chemical vapor deposition method for forming the connecting electrode 564. Furthermore, the connecting electrode 564 may also be formed by dropping and hardening (curing) an electroconductive paste.

As it has been described above, in the fourth embodiment, similarly as in the first embodiment, even when the drive voltage is low, it is possible to impart to the piezoelectric actuator 550 a sufficient amount of deformation for jetting the ink from the nozzles 25.

Figure 25A:
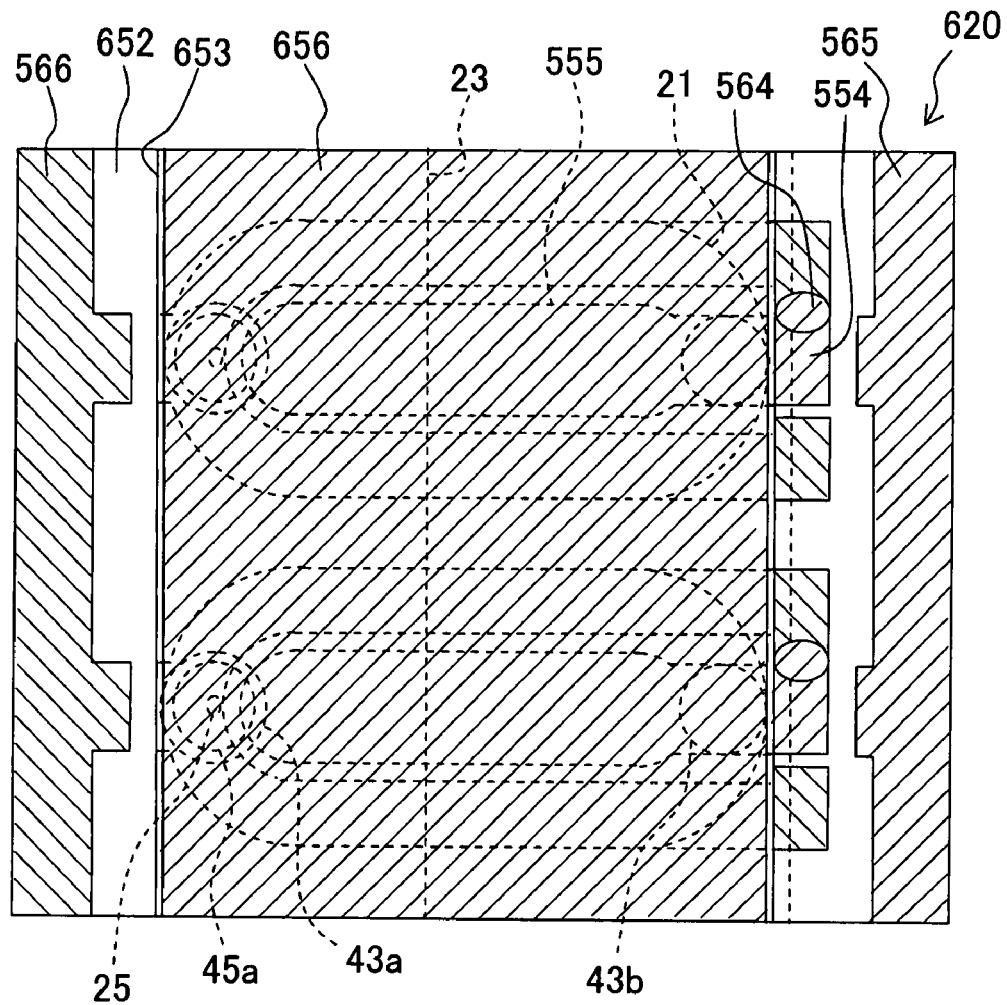
FIG. 25A and FIG. 25B are diagrams showing an ink-jet head according to a modified embodiment of the fourth embodiment.
Figure 25B:
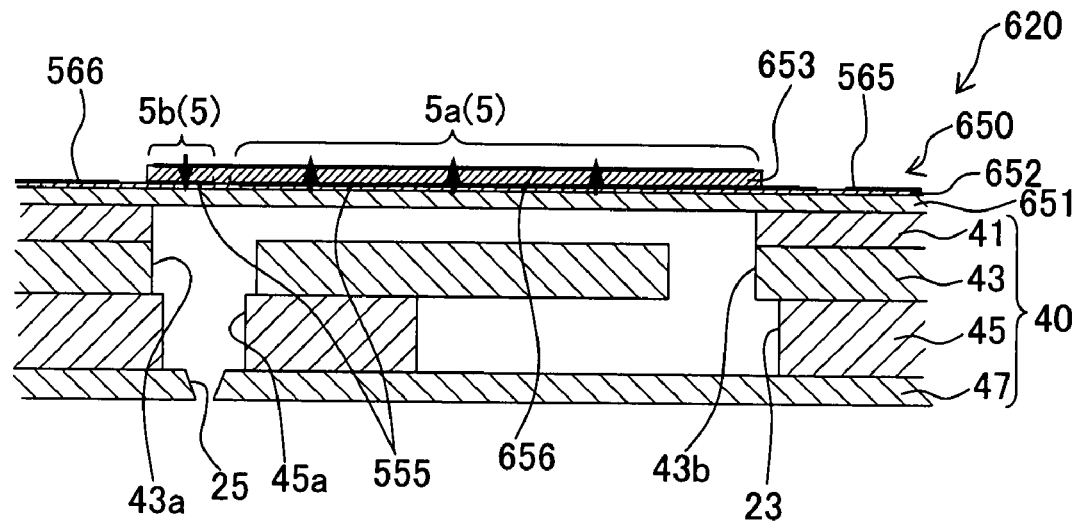
Figure 26A:
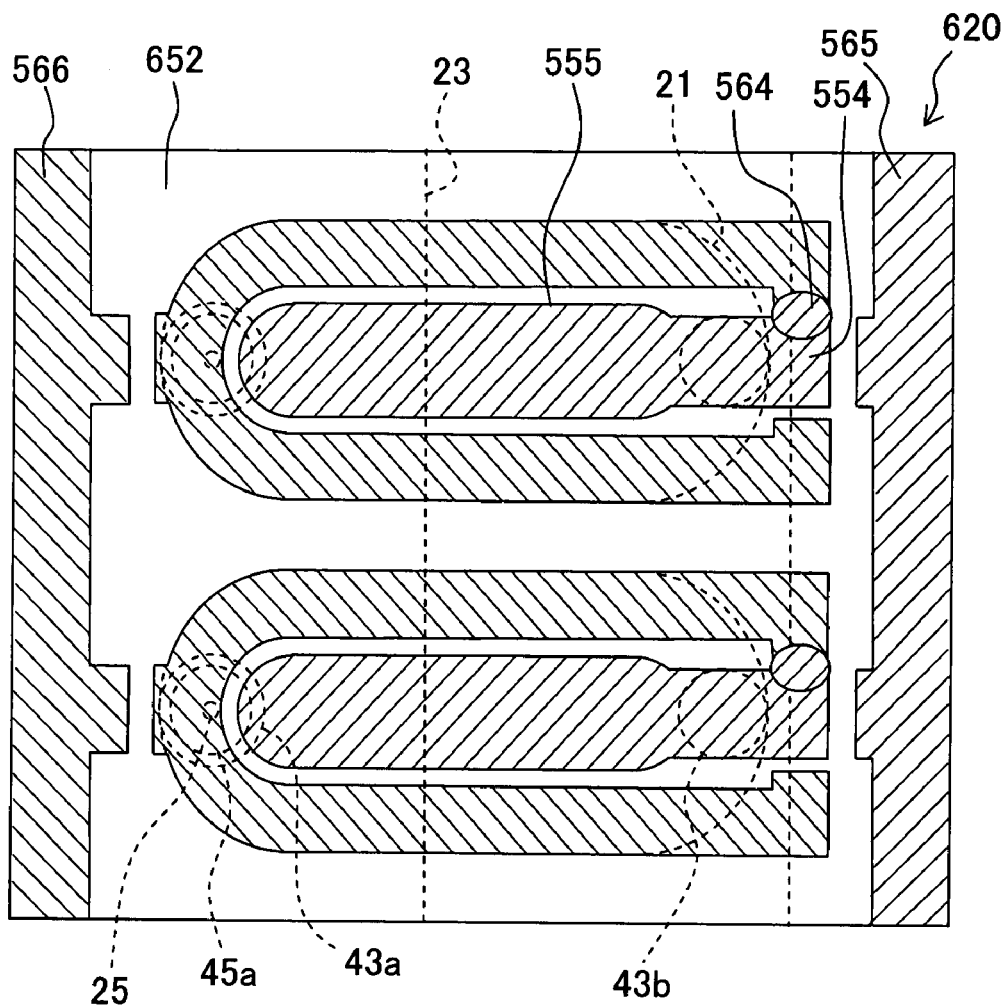
FIG. 26A and FIG. 26B are diagrams showing a state when a piezoelectric material layer of the ink-jet head shown in FIG. 25 is removed.
Figure 26B:
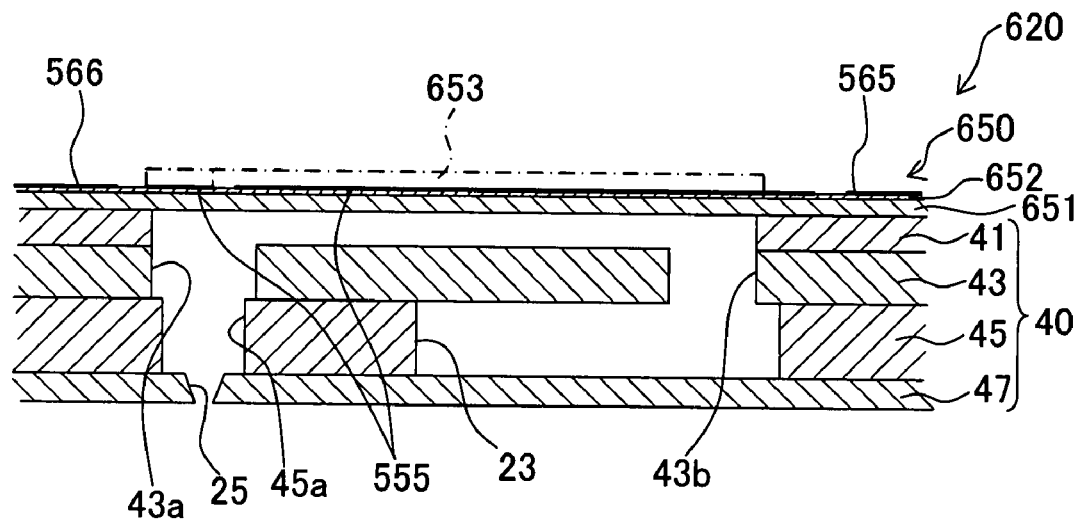

Here, a modified embodiment of the fourth embodiment will be described with reference to FIGS. 25A, 25B, 26A, and 26B. FIGS. 25A and 25B are diagrams showing an ink-jet head of the modified embodiment of the fourth embodiment, and FIGS. 26A and 26B are diagrams showing a state of the ink-jet head of the modified embodiment of the fourth embodiment, when a piezoelectric material layer 653 is removed. FIGS. 25A and 26A are diagrams showing a partial top view (when viewed from the side opposite to the side facing the recording paper), and FIGS. 25B and 26B are diagrams showing a cross-sectional view. In the modified embodiment of the fourth embodiment, the surface of the piezoelectric material 553 on which the first polarizing electrode 561 and the second polarizing electrode 562 are formed, is changed. In other words, in the fourth embodiment, the first polarizing electrode 561 and the second polarizing electrode 562 are formed on the surface (surface on the opposite side of the vibration plate 551) of the piezoelectric material layer 553, but in the modified embodiment of the fourth embodiment, the first polarizing electrode 561 and the second polarizing electrode 562 are formed on a surface of the piezoelectric material layer 653 on a side of a vibration plate 651.

As shown in FIG. 25B, a piezoelectric actuator 650 includes the vibration plate 651, an insulating film 652, the plurality of individual electrodes 555, the piezoelectric material layer 653, and a common electrode 656. The vibration plate 651 is arranged on the upper surface of the channel unit 40. The insulating film 652 is formed on a surface of the vibration plate 651. The individual electrodes 555 are formed on a surface of the insulating film 652, corresponding to the pressure chambers 21 respectively, similarly as in the fourth embodiment. The piezoelectric material layer 653 is formed on the surface of the insulating film 652 on which the individual electrodes 555 are formed. The common electrode 656 is formed on a surface of the piezoelectric material layer 653.

Furthermore, in the modified embodiment of the fourth embodiment, the piezoelectric material layer 653 has a width almost same as a length of the substantially elliptical pressure chamber 21 in a longitudinal direction, and is extended along a direction of arrangement (vertical direction in FIG. 25A) of the pressure chambers 21, and is facing the pressure chambers 21. In other words, the piezoelectric material layer 653 is not formed on both sides of a portion (location) of the piezoelectric actuator 650, facing a row of pressure chambers formed by the pressure chambers 21 in a plan view, and the insulating film 652 (or an electrode formed on the insulating film 652) is exposed.

Next, a manufacturing process of the piezoelectric actuator 650 of this modified embodiment will be described below. Firstly, similarly as in the fourth embodiment, the first polarizing electrode 561, the second polarizing electrode 562, the first connecting wire 565 and the second connecting wire 566 are formed on the surface of the insulating film 652 formed on the vibration plate 651 (first and second polarizing electrode forming step and first and second connecting wire forming step). Thereafter, the piezoelectric layer 653 and the common electrode 656 are formed (first electrode forming step). Next, similarly as in the fourth embodiment, a central portion 5a of an active portion 5 is polarized upward, and an edge portion 5b of the active portion 5 is polarized downward (first and second polarization step).

Furthermore, similarly as in the fourth embodiment, the first connecting wire 565 and the second connecting wire 566 are divided (first and second connecting wire dividing step);

and finally, the first polarizing electrode 561 and the second polarizing electrode 562 are electrically connected to form the individual electrode 555, by forming the connecting electrode 564 between the terminal portion 554 and the end portion bent to be hook-shaped, in the substantially U-shaped second polarizing electrode 562 (second electrode forming step). As shown in FIG. 25A, the piezoelectric material layer 553 (653) is not formed in a first position and a second position, the first position being a position where the first connecting wire 565 and the second connecting wire 566 are divided in the first and second connecting wire dividing step, and the second position being a position between the second polarizing electrode 562 and the terminal portion 554 forming the connecting electrode 564 in the second electrode forming step.

According to the modified embodiment of the fourth embodiment, similarly as in the fourth embodiment, even when the drive voltage is low, it is possible to impart to the piezoelectric actuator 650, an amount of deformation which is sufficient for jetting the ink from the nozzles 25. Furthermore, it is possible to use a plurality of stacked piezoelectric layers in which a plurality of electrodes are intervened. Even when an electrode among the plurality electrodes is intervened in two piezoelectric layer among the plurality of piezoelectric layer, the electrode can be connected/disconnected with another electrode at an area in which the piezoelectric layers are not formed.

The exemplary embodiments and modified embodiments of the present invention have been described above. However, the present invention is not restricted to the embodiments and the modified embodiments described above, and it is possible to carry out various design modifications which fairly fall within basic teaching herein set forth. For example, in the embodiments from the first embodiment to the fourth embodiment, and the modified embodiments of these embodiment, cases in which the plurality of the first polarizing electrodes 61 (261 and 561) and the second polarizing electrodes 62 (262 and 562) are connected mutually by the first connecting wire 65 (565, and connecting wire 265) and the second connecting wire 66 (566) have been described. However, the first connecting wire 65 (565, and connecting wire 265) and the second connecting wire 66 may be omitted.

Moreover, in the embodiments from the first embodiment to the third embodiment, and the modified embodiments of these embodiments, cases in which the active area 2 (4, 6, 8, and 9) have a same shape in a plan view as the shape of the pressure chamber 21 in a plan view, and the active area 2 is facing the pressure chamber 21 along the entire surface has been described. However, the present invention is not restricted to these cases. For example, the active area 2 (4, 6, 8, and 9) may have a shape in a plan view, which is slightly larger than the shape of the pressure chamber 21 in the plan view. In this case, since it is possible to deform the piezoelectric actuator 50 (150, 250, 350, and 450) spontaneously from an area surrounding the portion facing the pressure chamber 21, it is possible improve further the driving efficiency of the piezoelectric actuator 50 (150, 250, 350, and 450).

Moreover, in the abovementioned first embodiment and the modified embodiment of the first embodiment, the second embodiment, and the third embodiment, cases in which at the time of carrying out polarization, the vibration plate 51 (151, 251, and 551) which functions as a common electrode is used, or in other words, cases in which the electric field is applied between the vibration plate 51 (151, 251, and 551) and the first polarizing electrode 61 (261 and 561), and between the vibration plate 51 (151, 251, and 551) and the second polarizing electrode 62 (262 and 562), have been explained. In the third embodiment, a case in which, at the time of carrying out the polarization, the individual electrode 355 (455) is used, or in other words, a case in which the electric field is applied between the individual electrode 355 (455) and the first polarizing electrode 61, and between the individual electrode 355 (455) and the second polarizing electrode 62, has been described. However, the polarization may be carried out without using the vibration plate 51 (151 and 251) and the individual electrode 355 (455). In this case, an electrode specifically for polarization is formed on a surface of the piezoelectric material layer 53 (153, 253, 353, and 453) on an opposite side of a side on which the first polarizing electrode 61 (261) and the second polarizing electrode 62 (262) are formed, then this electrode specifically for polarization is removed after the first and second polarization step, and is joined to the vibration plate 51 (151, 251, 351, and 451) (in the third embodiment and the modified embodiment of the third embodiment, after forming the individual electrode 355 (455) and the insulating film 352 (452)).

Furthermore, in the abovementioned first embodiment and the second embodiment, and the modified embodiments thereof, cases in which after the individual electrode 55 (155 and 255) are formed; the first connecting wire 65 and the second connecting wire 66 (connecting wire 265) are divided; and connections between the plurality of individual electrodes 55 (155 and 255) are disconnected; have been explained. However, the present invention is not restricted to these cases. For example, in the first embodiment and the modified embodiment of the first embodiment, the connections between the first polarizing electrodes may be disconnected by dividing the first connecting wire 65, and the connections between the second polarizing electrodes 62 may be disconnected by dividing the second connecting wire 66, and thereafter, the individual electrode 55 (155) may be formed. Moreover, in the second embodiment, the individual electrode 255 may be formed after dividing the connecting wire 265 so that the second polarizing electrodes 262 are disconnected.

Moreover, in the second embodiment mentioned above, a case described below has been explained. That is, in step S13, the first polarization step, in which the first polarizing electrode 261 formed on the surface of the piezoelectric material layer 253, in the central portion of the area corresponding to the active portion 6 is used, is carried out. Then, in step S16, the second polarization step, in which the second polarizing electrode 262 formed on the surface of the surface of the piezoelectric material layer 253, in the edge portion of the area corresponding to the active portion 6 is used, is carried out. However, the present invention is not restricted to this case, and the second polarization step may be carried out before the first polarization step. In this case, the second polarizing electrode 262 is to be removed in the polarizing electrode removing step in step S14.

Furthermore, in the second embodiment described above, a case in which the second polarizing electrode 262 is formed on the surface of the piezoelectric material layer 253, along the entire circumference of the edge of the area corresponding to the active portion 6. However, the second polarizing electrode 262 may be formed only in a portion of the edge of the area corresponding to the active portion 6.

Moreover, in the second embodiment described above, a case in which the area in which the first polarizing electrode 261 is formed and the area in which the second polarizing electrode 262 is formed, overlap partially has been described. However, these areas may not overlap.

In the second embodiment described above, a case in which the connecting wire 265 connects the first polarizing electrodes 261 at the time of the first polarization step, and connects the second polarizing electrodes 262 at the time of the second polarization step has been described. However, a connecting wire which connects the first polarizing electrodes 261, and a connecting wire which connects the second polarizing electrodes 262 may be provided separately.

Moreover, in the abovementioned second embodiment and the fourth embodiment, and the modified embodiments thereof, cases in which the central portion 6a (3a and 5a) of the active portion 6 (3 and 5) is polarized upward, and the edge portion 6b (3b and 5b) of the active portion 6 (3 and 5) is polarized downward have been described. However, the present invention is not restricted to these cases, and the central portion 6a (3a and 5a) may be polarized downward, and the edge portion 6b (3b and 5b) may be polarized upward.

Furthermore, in the abovementioned third embodiment and the modified embodiment of the third embodiment, cases in which the individual electrode 355 (455) is formed on the lower surface (surface on a side of the insulating film 352 (452)) of the piezoelectric material layer 353 (453), and the common electrode 356 (456) is formed on the upper surface of the piezoelectric material layer 353 (453) have been described. However, the present invention is not restricted to these cases, and the common electrode 356 (456) may be formed on the lower surface of the piezoelectric material layer 353 (453), and the individual electrode 355 (455) may be formed on the upper surface of the piezoelectric material layer 353 (453).

Moreover, in the abovementioned third embodiment and the modified embodiment of the third embodiment, cases in which the central portion 8a (9a) and the edge portion 8b (9b) of the active portion 9 (10) are formed to be isolated have been described. However, the central portion 8a (9a) and the edge portion 8b (9b) may be formed without being isolated.

What is claimed is:

1. A method for manufacturing a piezoelectric actuator which includes a piezoelectric layer having a predetermined active portion, the method comprising:
    providing a vibration plate;
    providing a piezoelectric layer on a surface of the vibration plate;
    forming a first polarizing electrode on one surface of the piezoelectric layer, at a central portion of a first area of the piezoelectric layer, the first area overlapping with a predetermined active area to be the active portion of the piezoelectric layer;
    forming a second polarizing electrode on the one surface of the piezoelectric layer at an edge portion of the first area, the edge portion being different from the central portion;
    forming a first electrode on the other surface of the piezoelectric layer, at a second area overlapping entirely with the active area of the piezoelectric layer;
    polarizing a first portion of the piezoelectric layer in a predetermined direction by applying an electric field in the predetermined direction to the first portion which is arranged between the first electrode and the first polarizing electrode;
    polarizing a second portion of the piezoelectric material layer in an opposite direction opposite to the predetermined direction by applying an electric field in the opposite direction to the second portion which is arranged between the first electrode and the second polarizing electrode; and
    forming a second electrode, on the other surface of the piezoelectric layer, at a portion of the second area;
    wherein the first polarizing electrode and the second polarizing electrode are formed to be mutually isolated, and the first portion and the second portion are polarized simultaneously.

2. The method for manufacturing the piezoelectric actuator according to claim 1;
    wherein the vibration plate is electroconductive, and serves as the first electrode.

3. The method for manufacturing the piezoelectric actuator according to claim 1;
    wherein the first polarizing electrode and the second polarizing electrode are formed simultaneously.

4. A method for manufacturing a piezoelectric actuator which includes a piezoelectric layer having a predetermined active portion, the method comprising:
    providing a vibration plate;
    providing a piezoelectric layer on a surface of the vibration plate;
    forming a first polarizing electrode on one surface of the piezoelectric layer, at a central portion of a first area of the piezoelectric layer, the first area overlapping with a predetermined active area to be the active portion of the piezoelectric layer;
    forming a second polarizing electrode on the one surface of the piezoelectric layer at an edge portion of the first area, the edge portion being different from the central portion;
    forming a first electrode on the other surface of the piezoelectric layer, at a second area overlapping entirely with the active area of the piezoelectric layer;
    polarizing a first portion of the piezoelectric layer in a predetermined direction by applying an electric field in the predetermined direction to the first portion which is arranged between the first electrode and the first polarizing electrode;
    polarizing a second portion of the piezoelectric material layer in an opposite direction opposite to the predetermined direction by applying an electric field in the opposite direction to the second portion which is arranged between the first electrode and the second polarizing electrode; and
    forming a second electrode, on the other surface of the piezoelectric layer, at a portion of the second area;
    wherein after forming the first electrode and forming one of the first polarizing electrode and the second polarizing electrode, one of the first portion and the second portion corresponding to the one of the first polarizing electrode and the second polarizing electrode respectively is polarized, and then, after removing the one of the first polarizing electrode and the second polarizing electrode, the other of the first polarizing electrode and the second polarizing electrode is formed, and the other of the first portion and the second portion corresponding to the other of the first polarizing electrode and the second polarizing electrode is polarized.

5. The method for manufacturing the piezoelectric actuator according claim 4;
    wherein at the time of forming the other of the first polarizing electrode and the second polarizing electrode which is formed after the one of the first and second polarizing electrodes have been formed, the other of the first polarizing electrode and the second polarizing electrode is formed to partially overlap with an area at which the one of the first polarizing electrode and the second polarizing electrode has been formed.

6. The method for manufacturing the piezoelectric actuator according to claim 4;

wherein after forming the first polarizing electrode and the first electrode, polarizing the first area, removing the first polarizing electrodes, forming the second polarizing electrode, and polarizing the second area are performed in this order; and wherein at the time of forming the second polarizing electrode, the second polarizing electrode is formed entirely at a periphery of an edge portion of the first area.

7. The method for manufacturing the piezoelectric actuator according to claim 4;

wherein the active area includes a plurality of individual active areas, and the method further comprises:

forming the first polarizing electrode and the second polarizing electrode as a plurality of first individual polarizing electrodes and a plurality of second individual polarizing electrodes respectively, each corresponding to one of the individual active areas, at the time of forming the first polarizing electrode and the second polarizing electrode; and forming a plurality of connecting wires each of which connects the first individual polarizing electrodes with each other or connects the second individual polarizing electrodes with each other, one of the first individual electrodes and the second individual electrodes being formed by the formation of one of the first polarizing electrode and the second polarizing electrode;

wherein, upon removing one of the first and second polarizing electrodes, one of the first individual polarizing electrodes and the second individual polarizing electrodes are removed without removing one of the connecting wires; and wherein the other of the first individual polarizing electrodes and the second individual polarizing electrodes, which are formed by the formation of the other of the first polarizing electrode and the second polarizing electrode, are formed to be mutually connected by the other of the connecting wire.

8. A method for manufacturing a piezoelectric actuator which includes a piezoelectric layer having a predetermined active portion, the method comprising:

providing a vibration plate;

providing a piezoelectric layer on a surface of the vibration plate;

forming a first polarizing electrode on one surface of the piezoelectric layer, at a central portion of a first area of the piezoelectric layer, the first area overlapping with a predetermined active area to be the active portion of the piezoelectric layer;

forming a second polarizing electrode on the one surface of the piezoelectric layer at an edge portion of the first area, the edge portion being different from the central portion;

forming a first electrode on the other surface of the piezoelectric layer, at a second area overlapping entirely with the active area of the piezoelectric layer;

polarizing a first portion of the piezoelectric layer in a predetermined direction by applying an electric field in the predetermined direction to the first portion which is arranged between the first electrode and the first polarizing electrode;

polarizing a second portion of the piezoelectric material layer in an opposite direction opposite to the predetermined direction by applying an electric field in the opposite direction to the second portion which is arranged between the first electrode and the second polarizing electrode; and forming a second electrode, on the other surface of the piezoelectric layer, at a portion of the second area;

wherein the active area includes a plurality of individual active areas, and the method further comprises;

forming the first polarizing electrode and the second polarizing electrode as a plurality of first individual polarizing electrodes and a plurality of second individual polarizing electrodes, respectively, each corresponding to one of the individual active areas, at the time of forming the first polarizing electrode and the second polarizing electrode;

forming a first connecting wire which connects the first individual polarizing electrodes with each other, before polarizing the first area;

forming a second connecting wire which connects the second individual polarizing electrodes with each other, before polarizing the second area;

disconnecting the first individual polarizing electrodes by cutting off the first connecting wire, after polarizing the first area; and disconnecting the second individual polarizing electrodes by cutting off the second connecting wire, after polarizing the second area.

9. The method for manufacturing the piezoelectric actuator according to claim 8;

wherein after forming the second electrode, the first connecting wire and the second connecting wire are cut off.

10. A piezoelectric actuator comprising:

a piezoelectric layer in which a first electrode is formed on one surface thereof and a second electrode is formed on the other surface thereof, and in which a portion arranged between the first electrode and the second electrode is an active portion; and a vibration plate which is arranged on the one surface or the other surface of the piezoelectric layer;

wherein the piezoelectric layer is polarized in a direction parallel to a thickness direction thereof, and a first direction of polarization in a central portion of the active portion, and a second direction of polarization in an edge portion, of the active portion, which is different from the central portion are mutually opposite; and wherein one of the first and second electrodes includes:

a polarization electrode portion which is used for polarizing the piezoelectric layer; and a residual electrode portion which is formed to be connected to the polarization electrode portion so as to expand an area of the polarization electrode.

11. A liquid transporting apparatus which transports a liquid, comprising:

a piezoelectric actuator including a piezoelectric layer in which a first electrode is formed on one surface thereof, and a second electrode is formed on the other surface thereof, and in which a portion arranged between the first electrode and the second electrode is an active portion; and a vibration plate which is arranged on the one surface or the other surface of the piezoelectric layer; and a channel unit in which a plurality of nozzles, and a plurality of pressure chambers which communicate with the nozzles respectively are formed, and which is connected to the vibration plate of the piezoelectric actuator such that the active portion faces each of the pressure chambers;

wherein the piezoelectric layer is polarized in a direction parallel to a thickness direction of the piezoelectric layer, and a first direction of polarization in a central portion of the active portion, and a second direction of polarization of an edge portion, of the active portion, which is different from the central portion are mutually opposite; and wherein one of the first and second electrodes includes:
a polarization electrode portion which is used for polarizing the piezoelectric layer; and
a residual electrode portion which is formed to be connected to the polarization electrode portion so as to expand an area of the polarization electrode.

12. The liquid transporting apparatus according to claim 11;
wherein, when an electric field is applied between the first electrode and the second electrode, the first direction of polarization in the central portion of the active portion is opposite to a direction of the electric field, and the second direction of polarization in the edge portion of the active portion is same as the direction of the electric field.

13. The liquid transporting apparatus according to claim 11;
wherein a size of the active portion of the piezoelectric actuator is larger than a size of each of the pressure chambers in the channel unit.

* * * * *